United States Patent
Mori et al.

(10) Patent No.: US 7,417,001 B2
(45) Date of Patent: *Aug. 26, 2008

(54) GLASS CERAMIC COMPOSITION, GLASS-CERAMIC SINTERED BODY, AND MONOLITHIC CERAMIC ELECTRONIC COMPONENT

(75) Inventors: Naoya Mori, Omihachiman (JP); Yoichi Moriya, Omihachiman (JP); Jun Urakawa, Omihachiman (JP); Yasutaka Sugimoto, Kyoto (JP)

(73) Assignee: Murata Manufacturing Co., Ltd (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/563,435

(22) Filed: Nov. 27, 2006

(65) Prior Publication Data

US 2007/0128450 A1   Jun. 7, 2007

Related U.S. Application Data

(63) Continuation-in-part of application No. 11/507,501, filed on Aug. 22, 2006, now Pat. No. 7,368,408, which is a continuation-in-part of application No. 10/568,454, filed on Feb. 15, 2006, now Pat. No. 7,351,674, and a continuation-in-part of application No. PCT/JP05/01463, filed on Feb. 2, 2005.

(30) Foreign Application Priority Data

| Mar. 1, 2004 | (JP) | ............... 2004-055884 |
|---|---|---|
| May 6, 2004 | (JP) | ............... 2004-137388 |
| Dec. 21, 2005 | (JP) | ............... 2005-367843 |
| Jul. 14, 2006 | (JP) | ............... 2006-193557 |

(51) Int. Cl.
| C04B 35/46 | (2006.01) |
|---|---|
| C04B 35/465 | (2006.01) |
| C04B 35/47 | (2006.01) |
| C03C 14/00 | (2006.01) |
| C03C 10/04 | (2006.01) |

(52) U.S. Cl. ............... 501/32; 501/5; 501/122; 501/134; 501/136; 428/210; 428/701; 428/702

(58) Field of Classification Search ............... 501/5, 501/32, 122, 134, 135, 136, 137, 138, 139; 428/210, 432, 701, 702

See application file for complete search history.

(56) References Cited

U.S. PATENT DOCUMENTS 6,385,035 B1   5/2002   Matoba et al.

(Continued)

FOREIGN PATENT DOCUMENTS

JP   06-191887   7/1994

(Continued)

*Primary Examiner*—Karl E Group
(74) *Attorney, Agent, or Firm*—Dickstein, Shapiro, LLP.

(57) ABSTRACT

A glass ceramic composition for glass ceramic layers laminated in multilayer ceramic substrate included in multilayer ceramic module is provided. The glass ceramic composition contains a first ceramic powder mainly composed of forsterite, a second ceramic powder mainly composed of at least one material selected from $CaTiO_3$, $SrTiO_3$ and $TiO_2$, and a borosilicate glass powder containing $Li_2O$, $MgO$, $B_2O_3$, $SiO_2$, $ZnO$ and possibly $Al_2O_3$. The content of the borosilicate glass powder is about 3 percent by weight or more. The borosilicate glass powder further contains at least one additive selected from the group consisting of $CaO$, $BaO$ and $SrO$.

12 Claims, 6 Drawing Sheets

U.S. PATENT DOCUMENTS

| | | | |
|---|---|---|---|
| 6,448,195 B2 * | 9/2002 | Kishida et al. | 501/32 |
| 6,458,734 B1 | 10/2002 | Sugimoto et al. | |
| 6,946,415 B2 * | 9/2005 | Chikagawa et al. | 501/32 |
| 7,351,674 B2 | 4/2008 | Mori et al. | |
| 2006/0287184 A1 * | 12/2006 | Mori et al. | 501/32 |
| 2006/0293168 A1 * | 12/2006 | Mori et al. | 501/136 |
| 2007/0128450 A1 * | 6/2007 | Mori et al. | 428/432 |
| 2007/0237935 A1 | 10/2007 | Mori et al. | |

FOREIGN PATENT DOCUMENTS

| | | |
|---|---|---|
| JP | 06-206736 | 7/1994 |
| JP | 10-106880 | 4/1998 |
| JP | 11-228222 | 8/1999 |
| JP | 11-302034 | 11/1999 |
| JP | 11-310455 | 11/1999 |
| JP | 2000-143332 | 5/2000 |
| JP | 2000-185978 | 7/2000 |
| JP | 2000-344571 | 12/2000 |
| JP | 2001-080959 | 3/2001 |
| JP | 2002-016165 | 1/2002 |
| JP | 2002-097072 | 4/2002 |
| JP | 2002-104870 | 4/2002 |
| JP | 2002-128564 | 5/2002 |
| JP | 2002-265266 | 9/2002 |
| JP | 2003-002682 | 1/2003 |
| JP | 2003-002686 | 1/2003 |
| JP | 2003-026471 | 1/2003 |
| JP | 2003-119076 | 4/2003 |
| JP | 2003-342064 | 12/2003 |
| JP | 3550270 | 4/2004 |

* cited by examiner

GLASS CERAMIC COMPOSITION, GLASS-CERAMIC SINTERED BODY, AND MONOLITHIC CERAMIC ELECTRONIC COMPONENT

This is a continuation-in-part of application Ser. No. 11/507,501, filed Aug. 22, 2006, now U.S. Pat. No. 7,368,408, which is a continuation-in-part of application Ser. No. 10/568,454, filed Feb. 15, 2006, now U.S. Pat. No. 7,351,674, and a continuation-in-part of application Serial No. PCT/JP05/001463, deposited Feb. 02, 2005.

BACKGROUND OF THE INVENTION

1. Field of the Invention

The present invention relates to a glass ceramic composition containing a glass component in order that the glass ceramic composition can be fired at a low temperature, a sintered glass ceramic material obtained by firing the glass ceramic composition, and a multilayer ceramic electronic component including the sintered glass ceramic material.

2. Description of the Related Art

Examples of effective methods for miniaturizing electronic apparatuses include the use of multifunction electronic components in the electronic apparatus. Examples of multifunction electronic components include multilayer ceramic modules.

Multilayer ceramic modules include multilayer ceramic substrates. The ultilayer ceramic substrates may contain conductive leads for electrical connection and for constituting a passive element, such as a capacitor or an inductor. Furthermore, a variety of electronic components can be mounted on multilayer ceramic substrates.

Multilayer ceramic modules are small yet have multifunctionality. Thus, the use of the multilayer ceramic modules can achieve miniaturization of electronic apparatuses.

The demand for electronic apparatus operating at higher frequencies has been increasing in addition to the miniaturization described above. In this situation, it is desirable that multilayer ceramic modules for use in a high-frequency band include multilayer ceramic substrates having satisfactory high-frequency properties. Specifically, it is desirable that insulating ceramic layers constituting multilayer structures of multilayer ceramic substrates are composed of an insulating ceramic sinter having satisfactory high-frequency properties.

Japanese Unexamined Patent Application Publication No. 2000-344571 (Patent Document 1) discloses an insulating ceramic composition suitable as a sintered insulating ceramic material capable of satisfying the requirements. Patent Document 1 discloses an insulating ceramic composition with a ternary system of forsterite, calcium titanate, and spinel. The insulating ceramic composition in a more preferred composition range disclosed in Patent Document 1 has a Qf of about 38,000 GHz or more and a temperature coefficient of dielectric constant of about −80 to +40 ppm·°C.$^{-1}$, Qf being defined by frequency (GHz)/dielectric loss(tan δ).

When the multilayer ceramic substrate for the multilayer ceramic module is produced, a firing step is performed. In the firing step, conductive leads provided with the multilayer ceramic substrate are co-fired.

The conductive leads in the multilayer ceramic substrate must have low electrical resistance in order that the multilayer ceramic module can be used in a high-frequency region without problems. Thus, each conductive lead needs to be composed of a metal, such as copper or silver, having low resistivity.

However, a metal such as copper or silver has a relatively low melting point. To produce a multilayer ceramic substrate by cofiring a green substrate and a green conductive leads composed of the metal, an insulating ceramic composition for forming insulating ceramic layers constituting the multilayer ceramic substrate must be able to be fired at a low temperature, e.g., about 1,000° C. or lower.

Patent Document 1 discloses the insulating ceramic composition fired at a firing temperature of about 1,140° C. to 1,600° C. That is, the requirement that an insulating ceramic composition can be fired at about 1,000° C. or lower is not satisfied.

Furthermore, in order to provide a multilayer ceramic substrate capable of operating at higher frequencies and to provide higher-density conductive leads, insulating ceramic layers contained in the substrate need to have a lower dielectric constant. Patent Document 1 does not disclose the specific value of the dielectric constant of the insulating ceramic sinter obtained by firing the insulating ceramic composition disclosed therein.

Patent Document 2 reports an insulating ceramic composition capable of being fired at about 1,000° C. or lower, having a low dielectric constant, and having satisfactory high-frequency properties. Specifically, International Publication No. WO2005/082806 (Patent Document 2) reports an insulating ceramic composition capable of controlling the temperature coefficient of a resonance frequency at a low level and obtaining a higher Qf value.

Specifically, Patent Document 2 discloses a glass ceramic composition containing a first ceramic powder mainly composed of forsterite; a second ceramic powder containing at least one ceramic powder selected from the group consisting of a ceramic powder mainly composed of calcium titanate, a ceramic powder mainly composed of strontium titanate, and a ceramic powder mainly composed of titanium oxide; and a borosilicate glass powder, wherein the borosilicate glass powder contains about 3 to 15 percent by weight of lithium in the form of $Li_2O$, about 30 to 50 percent by weight of magnesium in the form of MgO, about 15 to 30 percent by weight of boron in the form of $B_2O_3$, about 10 to 35 percent by weight of silicon in the form of $SiO_2$, about 6 to 20 percent by weight of zinc in the form of ZnO, and about 0 to 15 percent by weight of aluminum in the form of $Al_2O_3$.

However, there have been advances in the reduction in the thickness of ceramic layers constituting multilayer ceramic electronic components in recent years. Furthermore, there has been an increase in signal voltage. Thus, the material constituting the ceramic layers needs to have higher electrical insulation reliability.

SUMMARY OF THE INVENTION

Accordingly, it is an object of the present invention to provide a glass ceramic composition having a composition capable of enhancing electrical insulation reliability in the material system of the glass ceramic composition disclosed in Patent Document 1.

It is another object of the present invention to provide an insulating ceramic sinter obtained by firing the glass ceramic composition; and a multilayer ceramic electronic component including the insulating ceramic sinter.

To overcome the above-described technical problems, an insulating ceramic composition according to preferred embodiments of the present invention includes a first ceramic powder mainly composed of forsterite; a second ceramic powder containing at least one ceramic powder selected from the group consisting of a ceramic powder mainly composed of calcium titanate, a ceramic powder mainly composed of strontium titanate, and a ceramic powder mainly composed of titanium oxide; and a borosilicate glass powder containing about 3 to 15 percent by weight of lithium in the form of $Li_2O$, about 20 to 50 percent by weight of magnesium in the form of MgO, about 15 to 30 percent by weight of boron in the form of $B_2O_3$, about 10 to 45 percent by weight of silicon in the form of $SiO_2$, about 6 to 20 percent by weight of zinc in the form of ZnO, and about 0 to 15 percent by weight of aluminum in the form of $Al_2O_3$, wherein the content of the borosilicate glass powder in the glass ceramic composition is about 3 percent by weight or more, the borosilicate glass powder contains at least one additive selected from the group consisting of calcium oxide, barium oxide and strontium oxide, the lower limit of the additive content of the borosilicate glass powder is about 2 percent by weight of the total amount of calcium oxide in the form of CaO, barium oxide in the form of BaO, and strontium oxide in the form of SrO, the upper limit of the calcium oxide content of the borosilicate glass powder in the form of CaO is about 15 percent by weight, the upper limit of the barium oxide content of the borosilicate glass powder in the form of BaO is about 25 percent by weight, and the upper limit of the strontium oxide content of the borosilicate glass powder in the form of SrO is about 25 percent by weight.

In the glass ceramic composition according to preferred embodiments of the present invention, the glass ceramic composition preferably contains about 55 percent by weight or more of the first ceramic powder, about 6 to 30 percent by weight of the second ceramic powder, and about 3 to 20 percent by weight of the borosilicate glass powder.

In the glass ceramic composition according to preferred embodiments of the present invention, when the second ceramic powder contains a ceramic powder mainly composed of calcium titanate, the calcium titanate content of the glass ceramic composition in the form of $CaTiO_3$ is preferably about 18 percent by weight or less; when the second ceramic powder contains a ceramic powder mainly composed of strontium titanate, the strontium titanate content of the glass ceramic composition in the form of $SrTiO_3$ is preferably about 13 percent by weight or less; and when the second ceramic powder contains a ceramic powder mainly composed of titanium oxide, the titanium oxide content of the glass ceramic composition in the form of $TiO_2$ is preferably about 0.3 to 30 percent by weight.

In the above-described preferred embodiments, when the second ceramic powder contains a ceramic powder mainly composed of calcium titanate and a ceramic powder mainly composed of titanium oxide, the calcium titanate content of the glass ceramic composition in the form of $CaTiO_3$ is more preferably about 8 to 12 percent by weight, and the titanium oxide content of the glass ceramic composition in the form of $TiO_2$ is more preferably about 0.3 to 3 percent by weight.

In the above-described preferred embodiments, when the second ceramic powder contains a ceramic powder mainly composed of strontium titanate and a ceramic powder mainly composed of titanium oxide, the strontium titanate content of the glass ceramic composition in the form of $SrTiO_3$ is more preferably about 6 to 10 percent by weight, and the titanium oxide content of the glass ceramic composition in the form of $TiO_2$ is more preferably about 0.3 to 3 percent by weight.

In the glass ceramic composition according to preferred embodiments of the present invention, the borosilicate glass powder preferably has a lithium content of about 3 to 15 percent by weight in the form of $Li_2O$, a magnesium content of about 20 to 50 percent by weight in the form of MgO, a boron content of about 15 to 30 percent by weight in the form of $B_2O_3$, a silicon content of about 23.5 to 26.5 percent by weight in the form of $SiO_2$, a zinc content of about 6 to 20 percent by weight in the form of ZnO, and an aluminum content of 0 to about 15 percent by weight in the form of $Al_2O_3$. In this case, the content of silicon in the borosilicate glass powder is further limited.

In the above-described preferred embodiments, the borosilicate glass powder contains about 23.5 to 26.5 percent by weight of silicon in the form of $SiO_2$. When the lower limit of the silicon content of the borosilicate glass powder in the form of $SiO_2$ is reduced to about 20 percent by weight, the glass ceramic composition according to preferred embodiments of the present invention preferably further contains about 1 part by weight or less of silicon in the form of $SiO_2$ relative to 100 parts by weight of the total amount of the first ceramic powder, the second ceramic powder, and the borosilicate glass powder.

The present invention may also be applied to a sintered glass ceramic material prepared by forming the above-described glass ceramic composition according to preferred embodiments of the present invention into a predetermined shape and firing the resulting perform at a temperature of about 1,000° C. or lower. The sintered glass ceramic material according to preferred embodiments of the present invention includes a $Mg_2SiO_4$ crystal phase as a main phase and a $Li_2(Mg, Zn)SiO_4$ crystal phase as a subphase.

The present invention may also be applied to a multilayer ceramic electronic component including a plurality of glass ceramic layers, the glass ceramic layers being laminated; and conductive leads disposed so as to correspond to the glass ceramic layers. The multilayer ceramic electronic component includes the glass ceramic layers composed of the above-described sintered glass ceramic material according to preferred embodiments of the present invention; and the conductive leads mainly composed of copper or silver.

The glass ceramic composition according to preferred embodiments of the present invention can be fired at about 1,000° C. or lower to yield a sintered glass ceramic material having satisfactory chemical stability, relatively low dielectric constant, a high Qf value, and a stable temperature coefficient ($\tau_f$) of resonance frequency.

When the multilayer ceramic electronic component is formed of the sintered glass ceramic material according to preferred embodiments of the present invention, conductive leads included in the multilayer ceramic electronic component can be mainly composed of copper or silver; hence, the multilayer ceramic electronic component can be suitably used for high-frequency applications.

Furthermore, in the glass ceramic composition according to preferred embodiments of the present invention, the borosilicate glass powder contains at least one compound selected from calcium oxide, barium oxide and strontium oxide as an additive, thereby improving the electrical insulation reliability of a sintered glass ceramic material obtained by firing the glass ceramic composition. The mechanism for improvement of insulation reliability is not exactly elucidated but is presumed as follows.

The sintered glass ceramic material according to preferred embodiments of the present invention basically includes a $Mg_2SiO_4$ crystal phase of the first ceramic powder and a Mg—Si—B—Zn—Li-based glass phase of the borosilicate glass powder. Furthermore, the sintered glass ceramic material has a microstructure where a $Li_2(Mg, Zn)SiO_4$ crystal phase is precipitated in the Mg—Si—B—Zn—Li-based glass phase. In the case of the second ceramic powder containing $TiO_2$, $MgTiO_3$ and $MgTi_2O_5$ crystal phases are further precipitated. An $AB_2O_5$ type crystal phase such as the MgTi$_2$O$_5$ crystal phase seems to cause the degradation of the insulation reliability. Thus, when Ca, Ba and/or Sr is added to the glass phase in advance, the added element reacts with TiO$_2$ to form an ABO$_3$ type crystal phase, such as CaTiO$_3$, BaTiO$_3$ or SrTiO$_3$ crystal phase; hence, the AB$_2$O$_5$ type crystal phase is not easily formed. That is, the ABO$_3$ type crystal phase, such as CaTiO$_3$, BaTiO$_3$ or SrTiO$_3$ crystal phase, is precipitated prior to the AB$_2$O$_5$ type crystal phase, such as MgTi$_2$O$_5$ crystal phase, thereby suppressing the precipitation of the AB$_2$O$_5$ type crystal phase, such as MgTi$_2$O$_5$ crystal phase, and suppressing the degradation of the insulation reliability.

Consequently, the use of a sintered glass ceramic material according to preferred embodiments of the present invention in a multilayer ceramic electronic component results in a reduction in the thickness of each glass ceramic layer contained in the multilayer ceramic electronic component.

In the glass ceramic composition according to preferred embodiments of the present invention, the content of the borosilicate glass powder can be reduced to about 20 percent by weight or less. Since the borosilicate glass powder is relatively expensive, the reduction in the content of the borosilicate glass powder is advantageous in reducing cost. Furthermore, the reduction in the content of the borosilicate glass powder facilitates control of the reaction of the second ceramic powder as an additive and the glass component, thereby resulting in easy control of the temperature coefficient ($\tau_f$) of resonant frequency with the additive. Moreover, it is possible to improve the plating resistance of the sintered glass ceramic material and the mass productivity of the multilayer ceramic electronic component.

In the glass ceramic composition according to preferred embodiments of the present invention, the second ceramic powder contains a ceramic powder mainly composed of calcium titanate and a ceramic powder mainly composed of titanium oxide, wherein the calcium titanate content is about 8 to 12 percent by weight in the form of CaTiO3, and the titanium oxide content is about 0.3 to 3 percent by weight in the form of TiO$_2$, relative to the glass ceramic composition. Thus, a sintered glass ceramic material obtained by firing the glass ceramic composition can more surely provide a temperature coefficient ($\tau_f$) of resonant frequency in the range of about ±10 ppm·°C.$^{-1}$.

In the glass ceramic composition according to preferred embodiments of the present invention, the second ceramic powder contains a ceramic powder mainly composed of strontium titanate and a ceramic powder mainly composed of titanium oxide, wherein the strontium titanate content is about 6 to 10 percent by weight in the form of SrTiO$_3$, and the titanium oxide content is about 0.3 to 3 percent by weight in the form of TiO$_2$, relative to the glass ceramic composition. Thus, a sintered glass ceramic material obtained by firing the glass ceramic composition can more surely provide a temperature coefficient ($\tau_f$) of resonant frequency in the range of about ±10 ppm·°C.$^{-1}$.

In the glass ceramic composition according to preferred embodiments of the present invention, the range of the silicon content of the borosilicate glass powder is further limited. That is, the borosilicate glass powder has a lithium content of about 3 to 15 percent by weight in the form of Li$_2$O, a magnesium content of about 20 to 50 percent by weight in the form of MgO, a boron content of about 15 to 30 percent by weight in the form of B$_2$O$_3$, a silicon content of about 23.5 to 26.5 percent by weight in the form of SiO$_2$, a zinc content of about 6 to 20 percent by weight in the form of ZnO, and an aluminum content of about 0 to 15 percent by weight in the form of Al$_2$O$_3$. Thus, when the glass ceramic composition is used in an element with capacitance, the rate of change of capacitance can be suppressed to about 0.5% or less before and after a load test. Consequently, when the element with capacitance is used to constitute a filter, the variation in filter properties due to a variation in capacitance can be reduced.

Furthermore, the glass ceramic composition may further contain about 1 part by weight or less of silicon in the form of SiO$_2$ relative to 100 parts by weight of the total amount of the first ceramic powder, the second ceramic powder, and the borosilicate glass powder, provided that the borosilicate glass powder has the same composition as the above-described composition except that the silicon content of the borosilicate glass powder is about 20 to 26.5 percent by weight in the form of SiO$_2$. In this case, the same effect as described above is achieved. Moreover, the lower limit of the silicon content of the borosilicate glass powder can be reduced from about 23.5 percent by weight to about 20 percent by weight, thus facilitating control of the silicon content.

Other features, elements, characteristics and advantages of the present invention will become more apparent from the following detailed description of preferred embodiments of the present invention with reference to the attached drawings.

DESCRIPTION OF THE PREFERRED EMBODIMENTS

Figure 1:
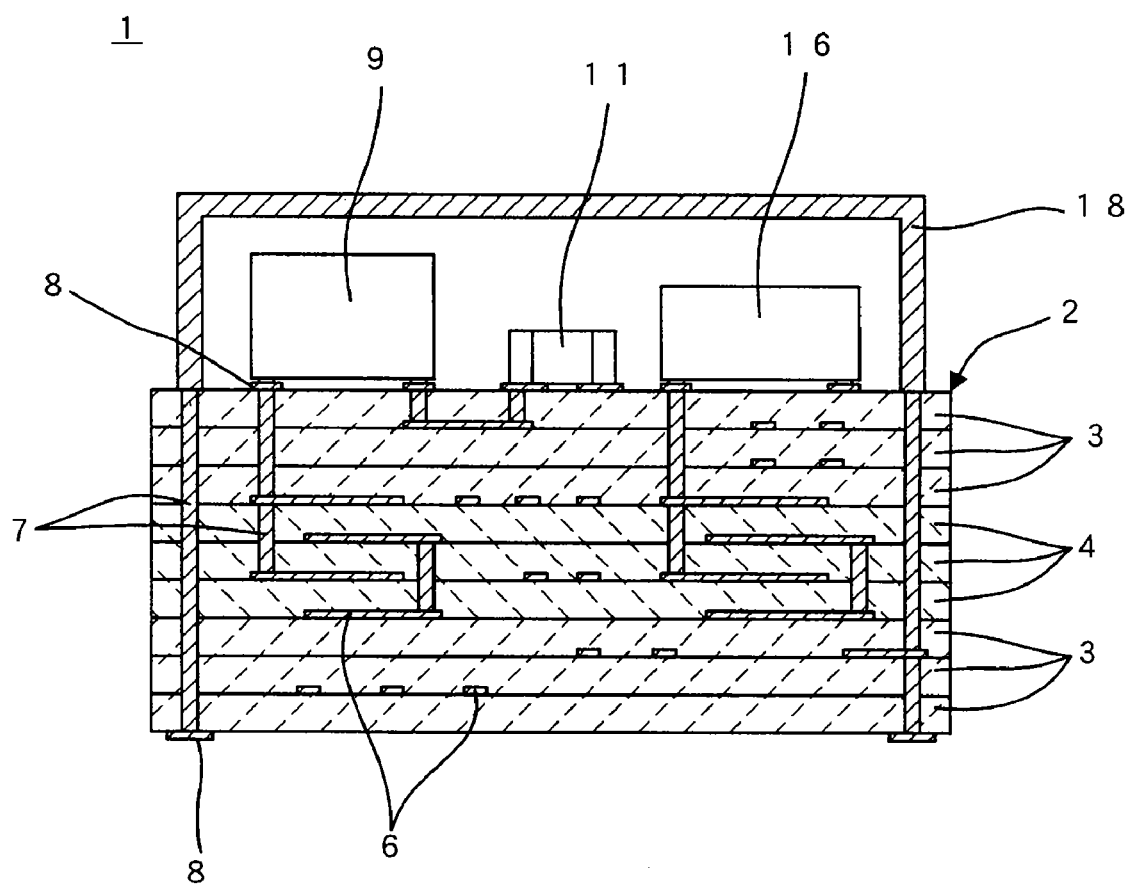
FIG. 1 is a cross-sectional view of a multilayer ceramic module 1 as an example of a multilayer ceramic electronic component including a glass ceramic composition according to preferred embodiments of the present invention.

A glass ceramic composition according to preferred embodiments of the present invention contains a first ceramic powder mainly composed of forsterite (Mg$_2$SiO$_4$); a second ceramic powder as an additive containing at least one ceramic powder selected from the group consisting of a ceramic powder mainly composed of calcium titanate (CaTiO$_3$), a ceramic powder mainly composed of strontium titanate (SrTiO$_3$) and a ceramic powder mainly composed of titanium oxide (TiO$_2$); and a borosilicate glass powder. In particular, the borosilicate glass powder has a characteristic composition.

The borosilicate glass powder contains about 3 to 15 percent by weight of lithium in the form of Li$_2$O, about 20 to 50 percent by weight of magnesium in the form of MgO, about 15 to 30 percent by weight of boron in the form of B$_2$O$_3$, about 10 to 45 percent by weight of silicon in the form of SiO$_2$, about 6 to 20 percent by weight of zinc in the form of ZnO, and 0 to about 15 percent by weight of aluminum in the form of Al$_2$O$_3$. The borosilicate glass powder has a composition that can particularly precipitates a $Li_2(Mg, Zn)SiO_4$ crystal phase. Thus, a sinter obtained from the borosilicate glass powder preferably can have higher Q value and higher reliability (moisture resistance).

Lithium contained in the borosilicate glass powder serves as a constituent of $Li_2(Mg, Zn)SiO_4$ and reduces the sintering temperature of the glass ceramic composition. The reasons the lithium content of the borosilicate glass powder in the form of $Li_2O$ is limited to about 3 to 15 percent by weight are described as follows: A lithium content of less than about 3 percent by weight results in failure of densification at about 1,000° C. or lower, failure of the precipitation of the $Li_2(Mg, Zn)SiO_4$ crystal phase in a sinter, and results in a reduction in Q value; and a lithium content exceeding about 15 percent by weight results in failure of precipitation of the $Li_2(Mg, Zn)SiO_4$ crystal phase in s sinter, results in a reduction in Q value, and results in deterioration in chemical stability and insulation reliability. The lithium content in the form of $Li_2O$ is more preferably about 4 to 10 percent by weight, thereby further increasing the Q value of a sinter.

Magnesium contained in the borosilicate glass powder serves as a constituent of the $Li_2(Mg, Zn)SiO_4$ crystal phase and reduces the melting temperature during glass production. The reasons the magnesium content of the borosilicate glass powder in the form of MgO is limited to about 20 to 50 percent by weight are described as follows: A magnesium content of less than about 20 percent by weight results in failure of the precipitation of the $Li_2(Mg, Zn)SiO_4$ crystal phase in a sinter and results in a reduction in Q value; and a magnesium content exceeding about 50 percent by weight results in devitrification.

The term "devitrification" defined here means the partial crystallization of glass. In a specific glass composition, crystallization easily occurs during steps of melting to rapid cooling a material powder, resulting in devitrification. The amount of crystals precipitated depends on cooling conditions and the like and in some cases, varies, thereby affecting the sinterability of the glass ceramic composition and dielectric properties of the sintered glass ceramic material. Furthermore, a glass ceramic material can be sintered by the use of a reduction in the viscosity of glass immediately before crystallization. Also in this case, the partial crystallization of glass and a variation in the amount of crystals precipitated may affect the sinterability of the glass ceramic composition and dielectric properties of the sintered glass ceramic material. Significant crystallization may cause the glass ceramic composition not to sinter.

The magnesium content is more preferably about 30 to 45 percent by weight in the form of MgO, thereby further increasing the Q value of a sinter.

The reasons the boron content of the borosilicate glass powder in the form of $B_2O_3$ is limited to about 15 to 30 percent by weight is described as follows: A magnesium content of less than about 15 percent by weight results in difficulty in vitrification; and a magnesium content exceeding about 30 percent by weight results in reductions in the moisture resistance, crystallinity, and Q value of a sinter and results in deterioration in chemical stability and insulation reliability.

The phrase "difficulty in devitrification" defined here means that the borosilicate glass powder is not formed into an amorphous state (vitrified state) because of a low content of a network-forming oxide, such as $SiO_2$ or $B_2O_3$. A low content of the network-forming oxide results in a mere calcine.

The boron content is more preferably about 15 to 25 percent by weight in the form of $B_2O_3$, thereby further increasing the Q value of the sinter and reducing reactivity with $CaTiO_3$, $SrTiO_3$ and $TiO_2$.

Silicon contained in the borosilicate glass powder serves as a constituent of the $Li_2(Mg, Zn)SiO_4$ crystal phase. The reasons the silicon content of the borosilicate glass powder in the form of $SiO_2$ is limited to about 10 to 45 percent by weight are described as follows: A silicon content of less than about 10 percent by weight results in low chemical stability of a sinter, thus causing devitrification in some cases; and a silicon content exceeding about 45 percent by weight results in difficulty in sintering at about 1,000° C. or lower. The silicon content in the form of $SiO_2$ is more preferably about 15 to 30 percent by weight, thereby further increasing the Q values of a sinter.

The silicon content of the borosilicate glass powder in the form of $SiO_2$ is still more preferably about 23.5 to 26.5 percent by weight. Thus, the rate of change of capacitance before and after a load test can be suppressed to 0.5% or less when the glass ceramic composition according to preferred embodiments of the present invention is used in an element with capacitance, e.g., a capacitor. The rate of change of capacitance is determined by the formula $(\%) = \{(C_1 - C_0)/C_0\} \times 100$ where $C_0$ represents capacitance before the test; and $C_1$ represents capacitance after the test.

Even when the range of the silicon content of the borosilicate glass powder is increased to about 20 to 26.5 percent by weight, the same effect as that described above can be achieved by incorporating 1 part by weight or less of a silicon powder in the form of $SiO_2$ relative to 100 parts by weight of the total amount of the first ceramic powder, the second ceramic powder, and the borosilicate glass powder.

In the case where the rate of change of the capacitance of a capacitor is suppressed to about 0.5% or lessand the element with capacitance is used to form a filter, the variation in filter properties due to capacitance change can be reduced. When the rate of change of capacitance exceeds about 0.5%, a variation in filter properties due to capacitance change reaches an unacceptable level, which is not preferable.

Zinc contained in the borosilicate glass powder serves as a constituent of the $Li_2(Mg, Zn)SiO_4$ crystal phase and increases the Q value of a sinter. The reasons the zinc content of the borosilicate glass powder in the form of ZnO is limited to about 6 to 20 percent by weight are described as follows: When the zinc content is less than about 6 percent by weight, $Li_2(Mg, Zn)SiO_4$ is not formed in a sinter. This may reduce the Q value and deterioration in chemical stability and insulation reliability. A zinc content exceeding about 20 percent by weight results in deterioration in chemical stability and insulation reliability.

Aluminum is not contained in the borosilicate glass powder in some cases. However, an aluminum content of about 15 percent by weight or less in the form of $Al_2O_3$ results in the improvement of the chemical stability of a sinter. In compositions according to embodiments of the present invention, $Al_2O_3$ serves as a network-forming oxide and thus makes it difficult to devitrify. As described above, the term "devitrification" means crystallization during glass production. The use of partially crystallized glass causes the nonuniformity of sinterability and electrical properties. An aluminum content exceeding about 15 percent by weight in the form of $Al_2O_3$ results in difficulty in sintering at about 1,000° C. or lower. The aluminum content is more preferably about 10 percent by weight or less in the form of $Al_2O_3$.

In the glass ceramic composition according to preferred embodiments of the present invention, the content of the borosilicate glass powder is preferably about 3 to 20 percent by weight.

As described above, the reason the content of the borosilicate glass powder is preferably about 3 percent by weight or more is described as follows: a borosilicate glass powder content of less than about 3 percent by weight may cause the glass ceramic composition not to sinter at about 1,000° C. or lower. The reasons the content of the borosilicate glass powder is preferably about 20 percent by weight or less is described as follows: a borosilicate glass powder content exceeding about 20 percent by weight results in an increase in the amount of expensive glass, thus disadvantageously increasing costs. Furthermore, an increase in the amount of the borosilicate glass powder tends to relatively reduce the proportion of the above-described crystal phase, thereby possibly reducing the Q value of the resulting sinter.

In other words, a lower content of the borosilicate glass powder is preferred as long as the content of the borosilicate glass powder is about 3 percent by weight or more. A borosilicate glass powder content of about 20 percent by weight or less, i.e., about 15 percent by weight or less, is sufficient for the composition. A reduction in the content of the borosilicate glass powder facilitates control of the second ceramic powder as an additive and the borosilicate glass powder, thereby easily adjusting temperature properties of resonant frequency with the additive.

The borosilicate glass powder contained in the glass ceramic composition according to preferred embodiments of the present invention contains at least one additive selected from the group consisting of calcium oxide, barium oxide and strontium oxide in order to improve electrical insulation reliability.

The lower limit of the additive content of the borosilicate glass powder is about 2 percent by weight of the total amount of calcium oxide in the form of CaO, barium oxide in the form of BaO and strontium oxide in the form of SrO, the upper limit of the calcium oxide content of the borosilicate glass powder in the form of CaO is about 15 percent by weight, the upper limit of the barium oxide content of the borosilicate glass powder in the form of BaO is about 25 percent by weight, and the upper limit of the strontium oxide content of the borosilicate glass powder in the form of SrO is about 25 percent by weight.

The reason the additive content is about 2 percent by weight or more is because insulation reliability is not substantially improved at an additive content of less than about 2 percent by weight. The reasons the content of calcium oxide in the form of CaO as an additive is about 15 percent by weight or less are because insulation reliability and the Q value decrease at a calcium content exceeding about 15 percent by weight. The reason the content of barium oxide in the form of BaO as an additive is about 25 percent by weight or less is because the Q value may decrease at a barium oxide content exceeding about 25 percent by weight. The reason the content of strontium oxide in the form of SrO as an additive is about 25 percent by weight or less is because the Q value may decrease at a strontium content exceeding about 25 percent by weight.

The addition of the additives, i.e., the addition of calcium oxide, barium oxide and strontium oxide in combination can further improve insulation reliability.

The glass ceramic composition according to preferred embodiments of the present invention preferably contains 55 percent by weight or more of the first ceramic powder; and 6 to 30 percent by weight of the second ceramic powder. Forsterite, which is a main constituent of the first ceramic powder, has a temperature coefficient ($\tau_f$) of −60 ppm/° C. $CaTiO_3$, which is a main constituent of the second ceramic powder, has a temperature coefficient ($\tau_f$) of +800 ppm/° C. $SrTiO_3$ has a temperature coefficient ($\tau_f$) of +1,700 ppm/° C. $TiO_2$ has a temperature coefficient ($\tau_f$) of +450 ppm/° C. Furthermore, borosilicate glass has a negative temperature coefficient ($\tau_f$). In order to achieve a temperature coefficient ($\tau_f$) in the range of +30 ppm/° C. with these materials, the above-described composition is preferred.

Forsterite, which is a main constituent of the first ceramic powder, preferably has a molar ratio of MgO to $SiO_2$, i.e., $MgO/SiO_2$, of about 1.92 to 2.04 because the chemical stability of a sinter may degrade at a ratio $MgO/SiO_2$ of less than about 1.92 or exceeding about 2.04. The first ceramic powder has a main crystal phase composed of forsterite ($Mg_2SiO_4$) with no other crystal phase. Alternatively, the first ceramic powder may further contain a small amount of at least one of a $SiO_2$ (quartz) crystal phase, a MgO crystal phase, and a $MgSiO_3$ (steatite) crystal phase, as other crystal phase.

In the first ceramic powder, the content of impurities other than forsterite is more preferably about 5 percent by weight or less because the Q value is reduced and chemical stability may degrade at an impurity content exceeding about 5 percent by weight. Examples of the impurities include $Al_2O_3$, $B_2O_3$, CaO, $Fe_2O_3$, $MnO_2$, NiO, $SnO_2$, SrO, ZnO, $P_2O_5$, $TiO_2$, $ZrO_2$, $Li_2O$, $Na_2O$ and $K_2O$.

The first ceramic powder preferably has a median particle size (D50) of about 1 μm or less because a median particle size (D50) exceeding about 1 μm may result in failure of densification at a borosilicate glass powder content of about 3 to 20 percent by weight.

The second ceramic powder as an additive serves to adjust the temperature properties of resonant frequency of a sinter.

When the second ceramic powder contains a ceramic powder mainly composed of $CaTiO_3$, the $CaTiO_3$ content is preferably about 18 percent by weight or less because a $CaTiO_3$ content exceeding 18 percent by weight may result in a reduction in the Q value of a sinter and results in an increase in dielectric constant to affect a transmission rate in a high-frequency band.

When the second ceramic powder contains a ceramic powder mainly composed of $SrTiO_3$, the $SrTiO_3$ content is preferably about 13 percent by weight or less because a $SrTiO_3$ content exceeding 13 percent by weight may result in a reduction in the Q value of a sinter and results in an increase in dielectric constant to affect a transmission rate in a high-frequency band.

A ceramic powder mainly composed of $TiO_2$ has the effect of increasing crystallinity. To sufficiently exert the effect, the second ceramic powder preferably contains about 0.3 percent by weight or more of the $TiO_2$. A $TiO_2$ content exceeding 30 percent by weight results in an increase in the dielectric constant of a sinter and affects the transmission rate in a high-frequency band. Thus, the content of the ceramic powder mainly composed of $TiO_2$ is preferably about 30 percent by weight or less.

When the second ceramic powder contains a ceramic powder mainly composed of calcium titanate and a ceramic powder mainly composed of titanium oxide, the calcium titanate content of the glass ceramic composition in the form of $CaTiO_3$ is preferably about 8 to 12 percent by weight, and the titanium oxide content of the glass ceramic composition in the form of $TiO_2$ is preferably about 0.3 to 3 percent by weight.

Alternatively, the second ceramic powder may contain a ceramic powder mainly composed of strontium titanate and a ceramic powder mainly composed of titanium oxide. In this case, $SrTiO_3$ and $TiO_2$ serve to control temperature properties of resonant frequency. In addition, the use of $SrTiO_3$ can achieve a low dielectric constant compared with the use of $CaTiO_3$ or $TiO_2$, provided that the equivalent temperature coefficient ($\tau_f$) is achieved. $TiO_2$ makes a great contribution to the promotion of crystallization of glass, i.e., $TiO_2$ makes a great contribution to a higher Q value of a sinter and the improvement of moisture resistance.

When the second ceramic powder contains a ceramic powder mainly composed of $SrTiO_3$ and a ceramic powder mainly composed of $TiO_2$, the content of the $SrTiO_3$-based ceramic powder in the glass ceramic composition is preferably about 6 to 10 percent by weight, and the content of the $TiO_2$-based ceramic powder in the glass ceramic composition is preferably about 0.3 to 3 percent by weight in order to reduce the dielectric constant of the sinter and to promote the crystallization of glass while other properties are not significantly degraded.

When the content of the $SrTiO_3$-based ceramic powder is less than about 6 percent by weight, the temperature coefficient of resonant frequency of a sinter tends to be a large negative value. When the content of the $SrTiO_3$-based ceramic powder exceeds about 1.0 percent by weight, the Q value of a sinter tends to decrease. Furthermore, when the content of the $TiO_2$-based ceramic powder is less than about 0.3 percent by weight, the crystal phase tends to be difficult to precipitate. When the content of the $TiO_2$-based ceramic powder exceeds about 3 percent by weight, the temperature coefficient of resonant frequency of a sinter tends to be a large positive value.

When the second ceramic powder contains a ceramic powder mainly composed of strontium titanate, the molar ratio of SrO to $TiO_2$, i.e., $SrO/TiO_2$, is preferably about 0.92 to 1.05.

At a ratio $SrO/TiO_2$ exceeding about 1.05, unreacted SrO sometimes remains in the form of a carbonate or the like, thereby reducing the Q value and degrading moisture resistance due to reaction with a glass component, in some cases. Furthermore, a $Sr_2TiO_4$ crystal phase or the like may be precipitated. The $Sr_2TiO_4$ has a small absolute value of the temperature coefficient of dielectric constant (TCC) compared with that of $SrTiO_3$. In the case where the $Sr_2TiO_4$ crystal phase or the like is precipitated, the amount of the second ceramic powder added is increased in order to adjust TCC of the entire system, thereby possibly reducing the Q value.

A ratio $SrO/TiO_2$ of less than about 0.92 may result in the precipitation of $SrTiO_3$ and $TiO_2$. In the present invention, $TiO_2$ may be separately added. Thus, electrical properties are controlled without problems by adjusting amounts of $SrTiO_3$ and $TiO_2$ added. However, the amounts of $SrTiO_3$ and $TiO_2$ added are adjusted in each production, thus possibly complicating control and increasing costs.

In the above-described case, the content of impurities in the ceramic powder mainly composed of strontium titanate is more preferably about 1 percent by weight or less. There are impurities contained in the starting material and impurities mixed during production steps. Examples of the impurities include $Nb_2O_5$, $Fe_2O_3$ and $Na_2O$. When the content of a single impurity or the total content of the impurities exceeds about 1 percent by weight, the Q value may decrease.

The specific surface area of the ceramic powder mainly composed of strontium titanate is more preferably about 1.5 to 7.5 $m^2/g$. A specific surface area of less than about 1.5 $m^2/g$ may result in difficulty in sintering. A specific surface area exceeding about 7.5 $m^2/g$ results in the enhancement of reactivity with glass, thus possibly reducing the Q value.

In the ceramic powder mainly composed of strontium titanate, the integrated intensity of an X-ray diffraction peak assigned to the $SrTiO_3(222)$ surface is more preferably about 1,000 or more because the crystallinity of $SrTiO_3$ is not very high at an integrated intensity of less than about 1,000 to increase reactivity with glass, thereby possibly reducing the Q value.

The above-described glass ceramic composition can be fired at about 1,000° C. or less to yield a sintered glass ceramic material. The resulting sintered glass ceramic material has a $Mg_2SiO_4$ crystal phase as a main phase and a $Li_2(Mg, Zn)SiO_4$ crystal phase as a subphase and is advantageously used to constitute a multilayer ceramic electronic component.

The glass ceramic composition according to preferred embodiments of the present invention may further contain a third ceramic powder containing at least one ceramic powder selected from a copper oxide-based ceramic powder mainly composed of copper oxide (CuO), a iron oxide-based ceramic powder mainly composed of iron oxide ($Fe_2O_3$), and a manganese oxide-based ceramic powder mainly composed of manganese oxide ($MnO_2$) in addition to the first ceramic powder, the second ceramic powder and the borosilicate glass powder described above. In this case, the total amount of the third ceramic powder is about 2.5 parts by weight or less and contains about 0.5 parts by weight or less of the copper oxide-based ceramic powder, about 1 part by weight or less of the iron oxide-based ceramic powder, and about 2 parts by weight or less of the manganese oxide-based ceramic powder, relative to 100 parts by weight of the total amount of the first ceramic powder, the second ceramic powder, and the borosilicate glass powder.

The use of the glass ceramic composition further containing the third ceramic powder described above can provide a sufficiently sintered glass ceramic material even at a lower content of the borosilicate glass powder, thereby relatively increasing the content of the first ceramic powder. Thus, the sintered glass ceramic material can surely have a Qf value of 10,000 GHz or more and a temperature coefficient ($\tau_f$) of resonant frequency in the range of ±30 ppm·° $C.^{-1}$.

Figure 2:
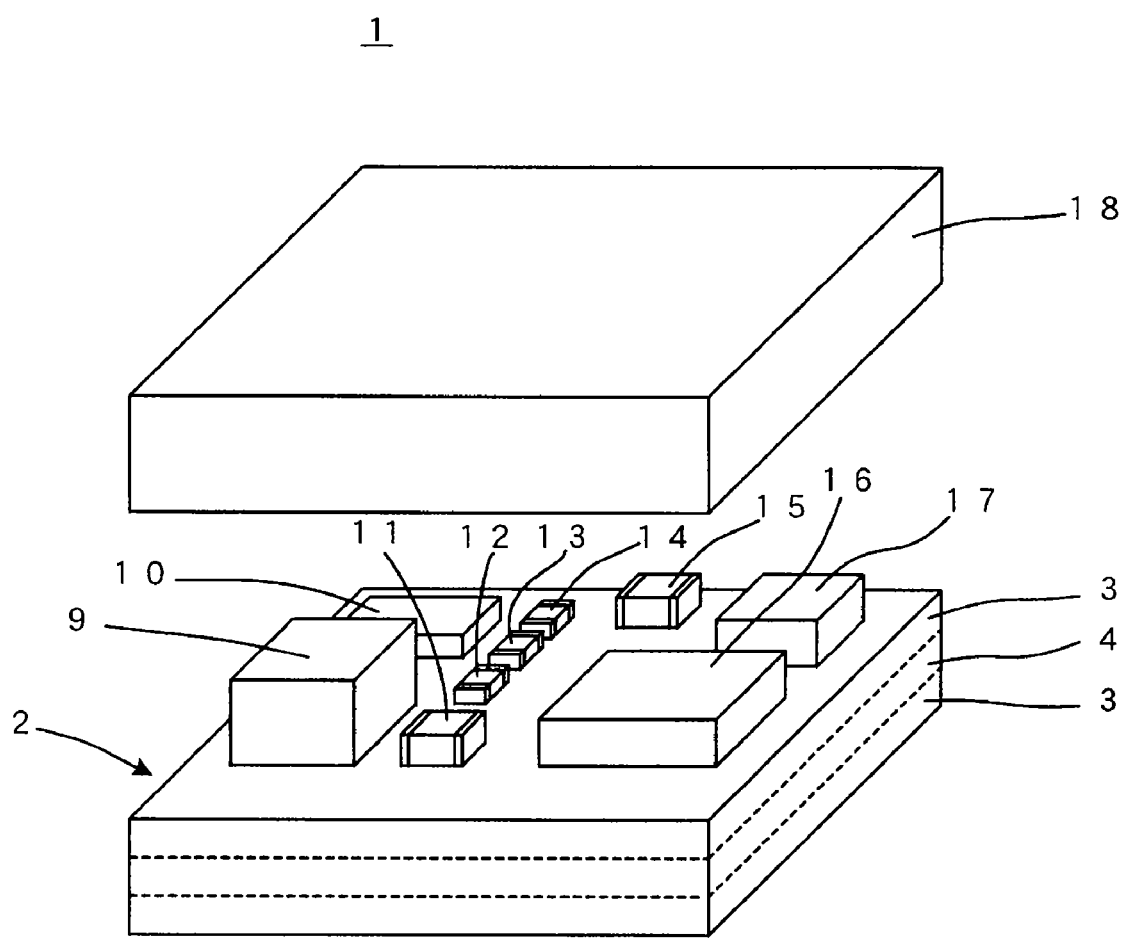
FIG. 2 is an exploded perspective view of the multilayer ceramic module 1 shown in FIG. 1.

FIG. 1 is a cross-sectional view of a multilayer ceramic module 1 as an example of a multilayer ceramic electronic component including a glass ceramic composition according to preferred embodiments of the present invention. FIG. 2 is an exploded perspective view of the multilayer ceramic module 1 shown in FIG. 1.

The multilayer ceramic module 1 includes a multilayer ceramic substrate 2. The multilayer ceramic substrate 2 includes a plurality of glass ceramic layers 3, the glass ceramic layers 3 being laminated; and a plurality of high-dielectric ceramic layers 4, the high-dielectric ceramic layers 4 being laminated, and the high-dielectric ceramic layers 4 being disposed between the glass ceramic layers 3.

The glass ceramic layers 3 are each composed of the sintered glass ceramic material obtained by firing the glass ceramic composition according to preferred embodiments of the present invention. For example, the glass ceramic layers 3 each have a relatively low dielectric constant of about 10 or less.

The high-dielectric ceramic layers 4 are each composed of, for example, barium titanate with glass. The high-dielectric ceramic layers 4 each have a dielectric constant of about 15 or more and preferably about 30 or more.

The multilayer ceramic substrate 2 includes various types of conductive leads. Typical examples of the conductive leads include inner conductive films 6 each disposed along a specific interface among the glass ceramic layers 3 and the high-dielectric ceramic layers 4; via-hole conductors 7 extending through specific layers among the glass ceramic layers 3 and the high-dielectric ceramic layers 4; and outer conductive films 8 disposed on a surface of the multilayer ceramic substrate 2.

Some of the inner conductive films 6 disposed so as to correspond to the high-dielectric ceramic layers 4 are disposed so as to provide capacitance, thereby forming capacitor elements.

The multilayer ceramic substrate 2 includes a plurality of electronic components 9 to 17 on the upper surface thereof. Among the electronic components 9 to 17 shown in the figure, for example, the electronic component 9 is a diode. The electronic component 11 is a multilayer ceramic capacitor. The electronic component 16 is a semiconductor IC. The electronic components 9 to 17 are electrically connected to specific films among outer conductive films 8 disposed on the upper surface of the multilayer ceramic substrate 2. The electronic components 9 to 17 and the conductive leads disposed in the multilayer ceramic substrate 2 constitute a circuit required for the multilayer ceramic module 1.

A conductive cap 18 for shielding the electronic components 9 to 17 is fixed on the upper surface of the multilayer ceramic substrate 2. The conductive cap 18 is electrically connected to specific conductors among the via-hole conductors 7.

The multilayer ceramic module 1 is mounted on a motherboard (not shown) with specific films among the outer conductive films 8 as connection terminals disposed on the lower surface of the multilayer ceramic substrate 2.

The multilayer ceramic module 1 can be produced by a well-known multilayer ceramic co-firing technique.

That is, first, ceramic green sheets for forming the glass ceramic layers 3 are produced. Specifically, an organic vehicle containing a binder resin and a solvent is added to the glass ceramic composition, i.e., a material composition, according to preferred embodiments of the present invention to form a ceramic slurry. The ceramic slurry is formed into sheets by a doctor blade method, dried, and stamped into a predetermined shape to form ceramic green sheets. To form the conductive leads on the ceramic green sheets, a conductive paste mainly composed of copper or silver is applied thereon to form a predetermined pattern.

Figure 3:
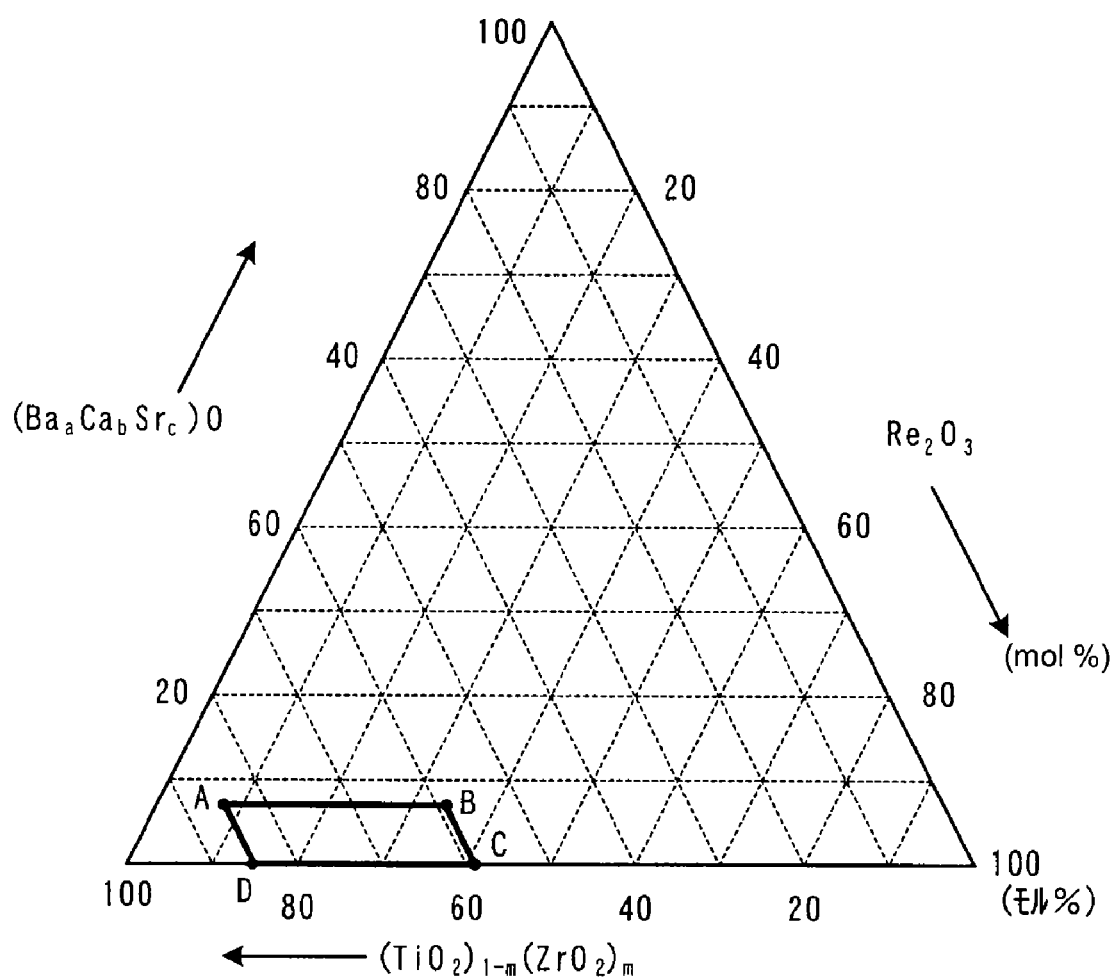
FIG. 3 is a ternary diagram showing a molar composition ratio (x, y, z) of x(Ba$_a$Ca$_b$Sr$_c$)O-y{(TiO$_2$)$_{1-m}$(ZrO$_2$)m}-z Re$_2$O$_3$, which is a main component in a preferred example of a high-dielectric constant material used in the multilayer ceramic module 1 shown in FIG. 1.

Ceramic green sheets for forming the high-dielectric ceramic layers 4 is produced, the ceramic green sheets including a high-dielectric ceramic composition. Specifically, one of the following compositions (1) to (4) can be prepared as the high-dielectric ceramic composition:

(1) a high-dielectric ceramic composition disclosed in Japanese Unexamined Patent Application Publication No. 2001-80959, the high-dielectric ceramic composition including 100 parts by weight of a principal constituent, about 0.1 to 25 parts by weight of a first secondary constituent composed of a $SiO_2$-based glass, and about 0.5 to 20 parts by weight of a Mn-containing second secondary constituent in the form of MnO, wherein the primary constituent is represented by the formula $x(Ba_aCa_bSr_c)O-y\{(TiO_2)_{1-m}(ZrO_2)_m\}-zRe_2O_3$ (wherein x, y, and z each represent mole percent, and x+y+z=100 on a molar basis; a+b+c=1; $0 \leq b+c<0.8$; $0 \leq m<0.15$; and Re is at least one rare earth element), and the mole fraction (x, y, z) of $(Ba_aCa_bSr_c)O$, $\{(TiO_2)_{1-m}(ZrO_2)_m\}$, and $Re_2O_3$ lies within a range surrounded by point A(7, 85, 8), point B(7, 59, 34), point C(0, 59, 41), and point D(0, 85, 15) in a ternary diagram shown in FIG. 3 wherein the line AB is not included;

(2) a high-dielectric ceramic composition disclosed in Japanese Unexamined Patent Application Publication No. 2002-97072, the high-dielectric ceramic composition including a $BaO-TiO_2-ReO_{3/2}$-based ceramic composition represented by the formula $xBaO-yTiO_2-zReO_{3/2}$ (wherein x, y, and z each represent mole percent and x+y+z=100; $8 \leq x<1.8$; $52.5 \leq y \leq 65$; $20 \leq z \leq 40$; and Re is at least one rare-earth element); and a glass composition containing about 10 to 25 percent by weight of $SiO_2$, about 10 to 40 percent by weight of $B_2O_3$, about 25 to 55 percent by weight of MgO, about 0 to 20 percent by weight of ZnO, about 0 to 15 percent by weight of $Al_2O_3$, about 0.5 to 10 percent by weight of $Li_2O$, and about 0 to 10 percent by weight of RO (wherein R represents at least one element selected from Ba, Sr, and Ca);

(3) a high-dielectric ceramic composition disclosed in Japanese Unexamined Patent Application Publication No. 11-310455, the high-dielectric ceramic composition including a mixture of a $BaO-TiO_2-ReO_{3/2}-BiO_3$-based ceramic powder (wherein Re represents a rare-earth element) and a glass powder containing about 13 to 50 percent by weight of $SiO_2$, about 3 to 30 percent by weight of $B_2O_3$, about 40 to 80 percent by weight of an alkaline-earth metal oxide, and about 0.1 to 10 percent by weight of $Li_2O$; and (4) a high-dielectric ceramic composition disclosed in Japanese Unexamined Patent Application Publication No. 11-228222, the high-dielectric ceramic composition including a mixture of a $BaO-TiO_2-ReO_{3/2}$-based ceramic powder (wherein Re represents a rare-earth element) and a glass powder containing about 13 to 50 percent by weight of $SiO_2$, about 3 to 30 percent by weight of $B_2O_3$, about 40 to 80 percent by weight of an alkaline-earth metal oxide, and about 0.5 to 10 percent by weight of $Li_2O$.

The high-dielectric ceramic composition (1) preferably further contains $Li_2O$.

Next, an organic vehicle containing a binder resin and a solvent is added to any one of the high-dielectric ceramic compositions (1) to (4) to form a ceramic slurry. The ceramic slurry is formed into sheets by a doctor blade method, dried, and stamped into a predetermined shape to form ceramic green sheets. To form the conductive leads on the ceramic green sheets, a conductive paste mainly composed of copper or silver is applied thereon to form a predetermined pattern.

A predetermined number of the resulting glass ceramic green sheets and high-dielectric ceramic green sheets are laminated in a predetermined order and pressed in the thickness direction.

The resulting green laminate is fired at a temperature of 1,000° C. or lower, for example, about 800° C. to 1000° C., to form the multilayer ceramic substrate 2. When each of the conductive leads is mainly composed of copper, firing is performed in a nonoxidizing atmosphere such as a nitrogen atmosphere. When each of the conductive leads is mainly composed of silver, firing is performed in an oxidizing atmosphere such as air.

The electronic components 9 to 17 are mounted on a surface of the multilayer ceramic substrate 2 by soldering or the like. The conductive cap 18 is attached to the multilayer ceramic substrate 2 to complete the multilayer ceramic module 1.

In the multilayer ceramic module 1, the glass ceramic layers 3 in the multilayer ceramic substrate 2 each contain the glass ceramic composition according to preferred embodiments of the present invention. Furthermore, each of the conductive leads 6 to 8 is mainly composed of a low-resistivity metal, such as copper or silver. Thus, it is possible to make the highly reliable multilayer ceramic module 1 having a low-dielectric glass ceramic layers 3, a satisfactory temperature properties of resonant frequency, and a high Q value and suitable for high-frequency applications. Furthermore, it is possible to make the multilayer ceramic module 1 having satisfactory insulation reliability.

Figure 4:
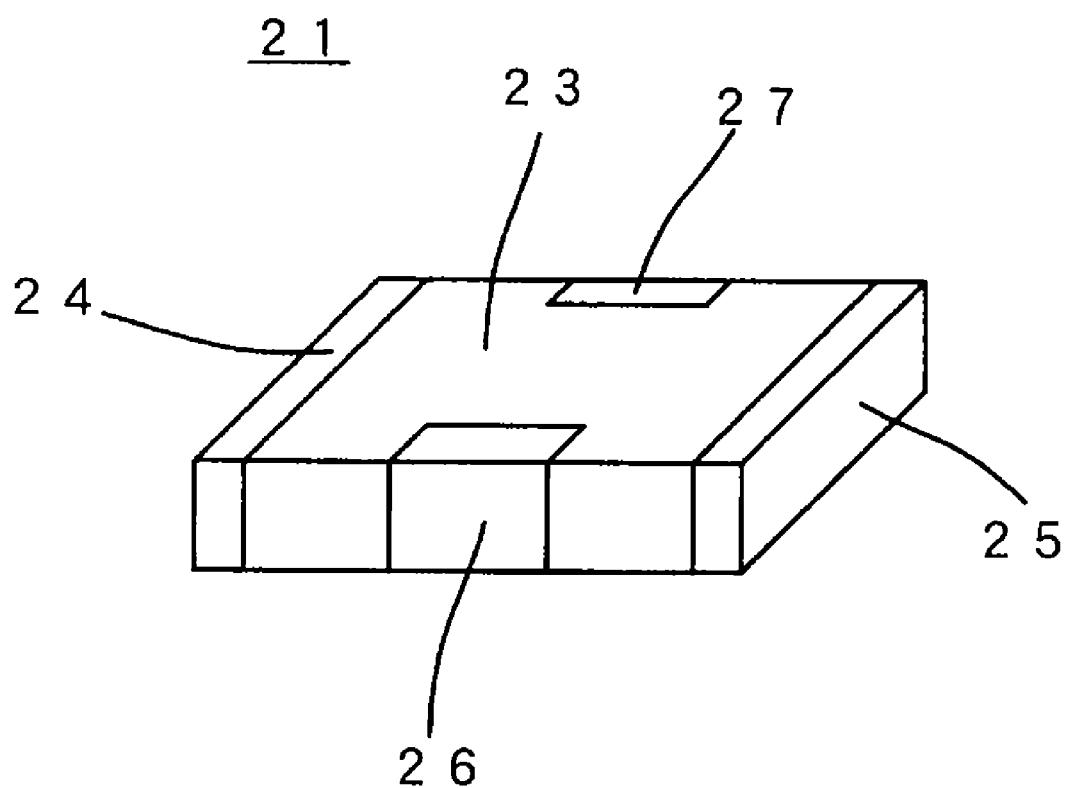
FIG. 4 is a perspective view of the appearance of an LC filter 21 as another example of the multilayer ceramic electronic component including a glass ceramic composition according to preferred embodiments of the present invention.
Figure 5:
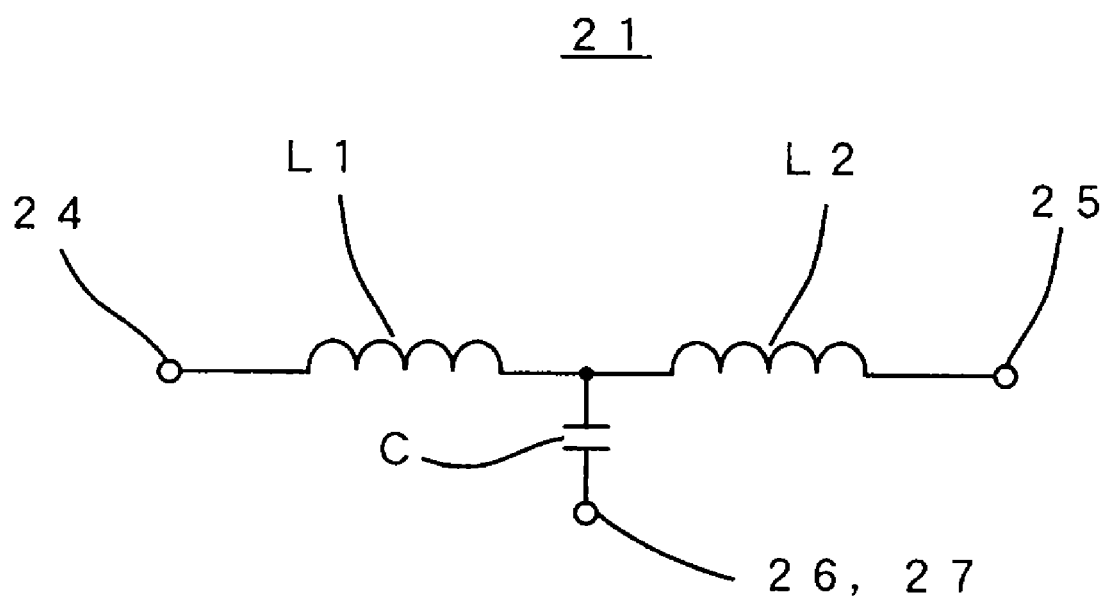
FIG. 5 is an equivalent circuit schematic representing the LC filter 21 shown in FIG. 4.
Figure 6:
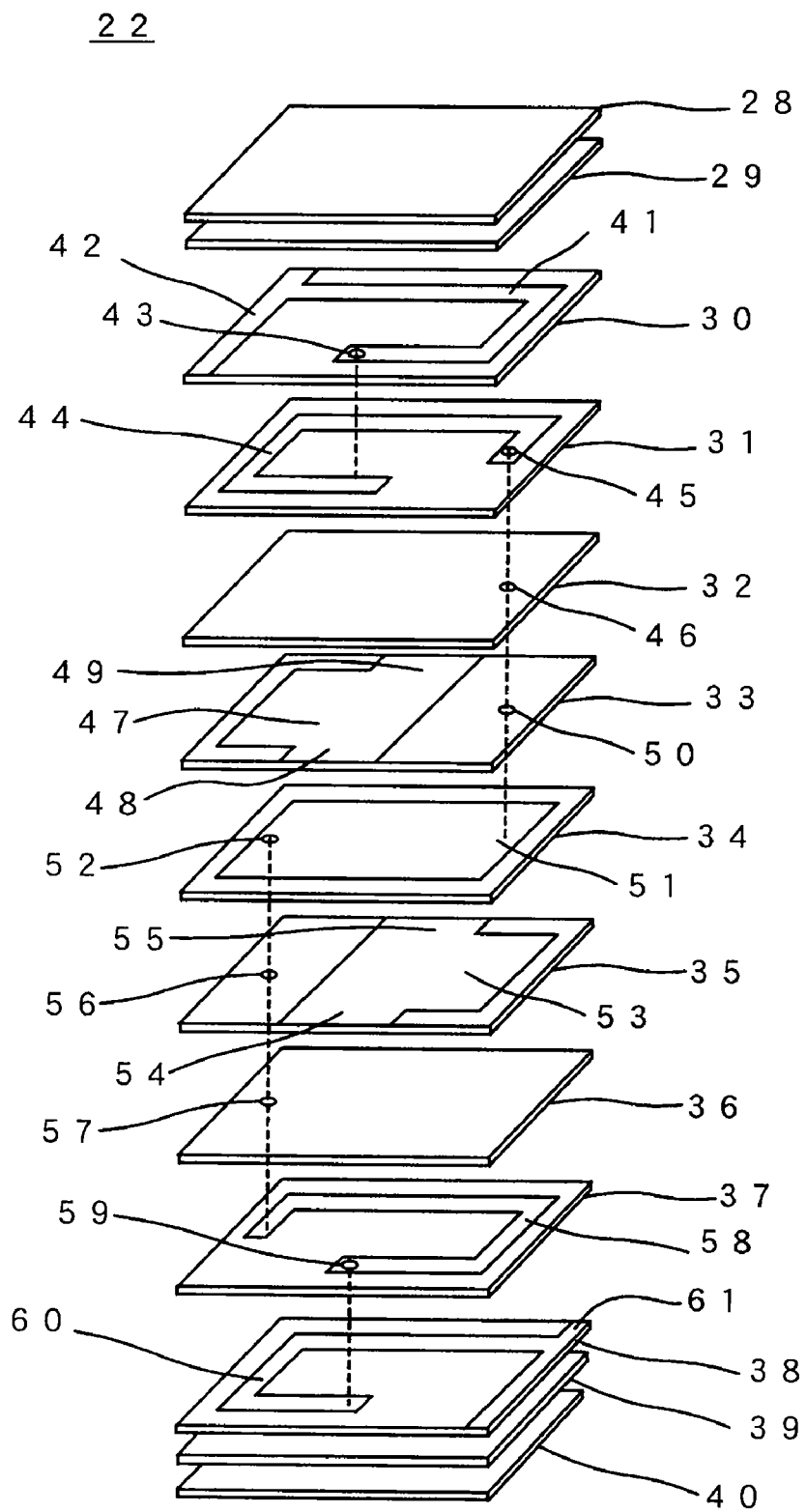
FIG. 6 is an exploded perspective view of a green laminate 22 as a semifinished product to be subjected to a firing step to form the LC filter 21 shown in FIG. 4.

FIGS. 4 to 6 are each an illustration of a LC filter 21 as another example of a multilayer ceramic electronic component including a glass ceramic composition according to preferred embodiments of the present invention. FIG. 4 is a perspective view of the appearance of the LC filter 21. FIG. 5 is an equivalent circuit schematic representing the LC filter 21. FIG. 6 is an exploded perspective view of a green laminate 22 as a semifinished product to be subjected to a firing step to form the LC filter.

As shown in FIG. 4, the LC filter 21 includes a main body 23 having a multilayer structure in which a plurality of glass ceramic layers are laminated; terminal electrodes 24 and 25 each disposed on the corresponding ends on the external surface of the main body 23; and terminal electrodes 26 and 27 each disposed on the middle of the corresponding side surface.

As shown in FIG. 5, the LC filter 21 includes series-connected two inductors L1 and L2 disposed between the terminal electrodes 24 and 25; and a capacitor C disposed between the connection point of the inductors L1 and L2 and the terminal electrodes 26 and 27.

Referring to FIG. 6, a green laminate 22 is to be main body 23 by firing. The green laminate 22 includes a plurality of ceramic green sheets 28 to 40, the ceramic green sheets being laminated. The number of ceramic green sheets laminated is not limited to the number shown in the figure.

Each of the ceramic green sheets 28 to 40 is formed by adding an organic vehicle containing a binder resin and a solvent to a glass ceramic composition according to preferred embodiments of the present invention, mixing the resulting mixture to form a ceramic slurry, forming the ceramic slurry into sheets by a doctor blade method, drying the sheets, and stamping the dry sheets into a predetermined shape.

To form the inductors L1 and L2 and the capacitor C shown in FIG. 5, conductive leads are disposed on specific sheets among the ceramic green sheets 28 to 40. The conductive leads each have a structure described below.

The ceramic green sheet 30 has a coil pattern 41 partially constituting the inductor L1; a leading pattern 42 extending from one end of the coil pattern 41; and a via-hole conductor 43 disposed on the other end of the coil pattern 41.

The ceramic green sheet 31 has a coil pattern 44 partially constituting the inductor L1; and a via-hole conductor 45 disposed on one end of the via-hole conductor 44. The via-hole conductor 43 is connected to the other end of the coil pattern 44.

The ceramic green sheet 32 has a via-hole conductor 46 connected to the via-hole conductor 45.

A ceramic green sheet 33 has a capacitor pattern 47 partially constituting the capacitor C; and leading patterns 48 and 49 extending from the capacitor pattern 47. Furthermore, the ceramic green sheet 33 has a via-hole conductor 50 connected to the via-hole conductor 46.

A ceramic green sheet 34 has a capacitor pattern 51 partially constituting the capacitor C; and a via-hole conductor 52 connected to the capacitor pattern 51. The capacitor pattern 51 is connected to the via-hole conductor 50.

A ceramic green sheet 35 has a capacitor pattern 53 partially constituting the capacitor C; and leading patterns 54 and 55 extending from the capacitor pattern 53. Furthermore, the ceramic green sheet 35 has a via-hole conductor 56 connected to the via-hole conductor 52.

A ceramic green sheet 36 has a via-hole conductor 57 connected to the via-hole conductor 56.

A ceramic green sheet 37 has a coil pattern 58 partially constituting the inductor L2; and a via-hole conductor 59 disposed at one end of the coil pattern 58. The via-hole conductor 57 is connected to the other end of the coil pattern 58.

A ceramic green sheet 38 has a coil pattern 60 partially constituting the inductor L2; and leading pattern 61 extending from one end of the coil pattern 60. The via-hole conductor 59 is connected to the other end of the coil pattern 60.

A conductive paste mainly composed of copper or silver is used to form the coil patterns 41, 44, 58, and 60, the leading patterns 42, 48, 49, 54, 55, and 61, the via-hole conductors 43, 45, 46, 50, 52, 56, 57, and 59, and the capacitor patterns 47, 51, and 53 as the conductive leads. The conductive paste can be applied to the sheets by screen printing.

To form the green laminate 22, the ceramic green sheets 28 to 40 are laminated in the order shown in FIG. 6 and pressed in the thickness direction.

The green laminate 22 is fired at a temperature of 1,000° C. or lower, e.g., about 800° C. to 1,000° C., to form the main body 23 shown in FIG. 4. Firing is performed in the same way as the multilayer ceramic module 1 described above. That is, when each of the conductive leads is mainly composed of copper, firing is performed in a nonoxidizing atmosphere such as a nitrogen atmosphere. When each of the conductive leads is mainly composed of silver, firing is performed in an oxidizing atmosphere such as air.

The terminal electrodes 24 to 27 are formed on the external surface of the main body 23. For example, the terminal electrodes 24 to 27 are formed by applying and baking a conductive paste mainly composed of copper or silver or by a thin-film-forming method, such as evaporation, plating, or sputtering.

Thereby, the LC filter 21 can be produced.

As described above, each of the ceramic green sheets 28 to 40 is composed of the glass ceramic composition according to preferred embodiments of the present invention. Among the ceramic green sheets 28 to 40, preferably, the ceramic green sheets 33 and 34 that directly contribute to the formation of the capacitor C are each composed of the high-dielectric ceramic composition for constituting the high-dielectric ceramic layers 4 included in the multilayer ceramic module 1 shown in FIG. 1.

The multilayer ceramic electronic component including the glass ceramic composition according to preferred embodiments of the present invention is not limited to the multilayer ceramic module 1 or the LC filter 21 shown in the figures. Examples of a component containing the glass ceramic composition according to preferred embodiments of the present invention include various multilayer ceramic substrates, such as multilayer ceramic substrates for multichip modules and multilayer ceramic substrate for hybrid integrated circuits (ICs); various combined electronic components in which electronic components are mounted on the multilayer ceramic substrates; and various multilayer chip electronic components, such as multilayer chip capacitors and multilayer chip dielectric antennae.

Experimental examples for verifying characteristics obtained by the glass ceramic composition according to preferred embodiments of the present invention and for determining the range or more preferred range of the glass ceramic composition according to preferred embodiments of the present invention will be described.

EXPERIMENTAL EXAMPLE 1

Borosilicate glass powders, having various compositions shown in Table 1, each contained in a glass ceramic composition were prepared.

TABLE 1

| Type of glass | $Li_2O$ (wt %) | MgO (wt %) | BaO (wt %) | CaO (wt %) | SrO (wt %) | $B_2O_3$ (wt %) | $SiO_2$ (wt %) | ZnO (wt %) | $Al_2O_3$ (wt %) | Remarks |
|---|---|---|---|---|---|---|---|---|---|---|
| G1 * | 2 | 33 | 3 | — | 2 | 25 | 27 | 8 | — | |
| G2 | 3.5 | 33 | 2 | 1 | 2 | 25 | 25.5 | 8 | — | |
| G3 | 15 | 23 | 2 | — | 7 | 20 | 23 | 10 | — | |
| G4 * | 16.5 | 25 | 7 | — | — | 20 | 21.5 | 10 | — | |
| G5 * | 6 | 18 | 5 | — | 5 | 26 | 28 | 8 | 4 | |
| G6 | 6 | 23 | 2 | 2 | 3 | 26 | 26 | 8 | 4 | |
| G7 | 5 | 45 | 4 | — | — | 22 | 18 | 6 | — | |
| G8 * | 5 | 52 | 4 | — | — | 18 | 15 | 6 | — | Devitrified |
| G9 * | 8 | 34 | 3 | 1 | 6 | 14 | 25 | 7 | 2 | Difficulty in vitrification |
| G10 | 8 | 34 | 3 | 2 | 3 | 16 | 25 | 7 | 2 | |
| G11 | 6 | 24 | 3 | 1 | 6 | 29 | 21 | 10 | — | |
| G12 * | 6 | 23 | 3 | 1 | 6 | 31 | 20 | 10 | — | |
| G13 * | 10 | 33 | 3 | 2 | 5 | 23 | 9 | 10 | 5 | Devitrified |
| G14 | 10 | 38 | 3 | — | — | 23 | 11 | 10 | 5 | |
| G15 | 5 | 33 | 5 | — | 8 | 18 | 25 | 6 | — | |
| G16 * | 6 | 23 | 4 | — | — | 15 | 46 | 6 | — | |
| G17 * | 6 | 25 | 3 | — | 3 | 28 | 31 | 4 | — | |
| G18 | 6 | 25 | 3 | — | 5 | 24 | 31 | 6 | — | |
| G19 | 6 | 29 | 2 | 5 | 1 | 19 | 18 | 20 | — | |
| G20 * | 6 | 30 | 5 | — | — | 19 | 18 | 22 | — | |
| G21 * | 6 | 30 | — | — | 5 | 20 | 15 | 8 | 16 | |
| G22 | 6 | 27 | 3 | 1 | 4 | 20 | 16.5 | 8 | 14.5 | |
| G23 * | 5 | 25 | 27 | — | — | 17 | 19 | 7 | — | |
| G24 | 5 | 23 | 25 | — | — | 18 | 23 | 6 | — | |
| G25 | 4 | 33 | 16 | — | — | 17 | 23 | 7 | — | |
| G26 * | 6 | 28 | 1 | 16 | — | 18 | 24 | 7 | — | |
| G27 | 6 | 35 | 1 | 10 | — | 19 | 23 | 6 | — | |
| G28 * | 6 | 22 | 1 | — | 27 | 16 | 22 | 6 | — | |
| G29 | 6 | 22 | 1 | — | 25 | 18 | 20 | 8 | — | |
| G30 | 6 | 32 | 1 | — | 12 | 19 | 23 | 7 | — | |

In Table 1, a "type of glass" marked with an asterisk "*" represents a glass powder having a composition outside the range of the present invention.

The glass powders shown in Table 1 except for glass G8, G9, and G13 which were devitrified or difficult to vitrify were pulverized so as to have an average particle size of about 1 to 2 μm to form borosilicate glass powders for glass ceramic compositions.

A $Mg_2SiO_4$ powder having an average particle size (median particle size D50) of about 0.8 μm was prepared as the first ceramic powder contained in a glass ceramic composition. As the second ceramic powder, a $CaTiO_3$ powder having an average particle size of about 1.5 μm, a $SrTiO_3$ powder having an average particle size of about 1.5 μm, and a $TiO_2$ powder having an average particle size of about 1.0 μm were prepared.

The first ceramic powder was mixed with the borosilicate glass powder and the second ceramic powder to form glass ceramic compositions corresponding to the samples shown in Table 2.

TABLE 2

| Sample | Amount of first ceramic powder (wt %) | borosilicate glass Type | borosilicate glass Amount (wt %) | Second ceramic powder Type | Second ceramic powder Amount (wt %) |
|---|---|---|---|---|---|
| 1 * | 70.0 | G1 | 20.0 | CT | 10.0 |
| 2 | 70.0 | G2 | 20.0 | CT | 10.0 |
| 3 | 85.0 | G3 | 3.0 | CT | 12.0 |
| 4 * | 85.0 | G4 | 3.0 | CT | 12.0 |
| 5 * | 77.0 | G5 | 15.0 | ST | 8.0 |
| 6 | 77.0 | G6 | 15.0 | ST | 8.0 |
| 7 | 74.0 | G7 | 15.0 | ST | 11.0 |
| 8 | 75.0 | G10 | 15.0 | ST | 10.0 |
| 9 | 72.0 | G11 | 15.0 | ST | 13.0 |
| 10 * | 78.0 | G12 | 15.0 | CT | 7.0 |
| 11 | 84.0 | G14 | 8.0 | CT | 8.0 |
| 12 | 84.0 | G15 | 9.0 | ST | 7.0 |
| 13 * | 74.0 | G16 | 18.0 | CT | 8.0 |
| 14 * | 75.0 | G17 | 15.0 | CT | 10.0 |
| 15 | 75.0 | G18 | 15.0 | CT | 10.0 |
| 16 | 72.0 | G19 | 20.0 | ST | 8.0 |
| 17 * | 72.0 | G20 | 20.0 | ST | 8.0 |
| 18 * | 66.5 | G21 | 19.0 | CT | 14.5 |
| 19 | 66.5 | G22 | 19.0 | CT | 14.5 |
| 20 * | 80.0 | G23 | 10.0 | ST | 10.0 |
| 21 | 80.0 | G24 | 10.0 | ST | 10.0 |
| 22 | 79.0 | G25 | 10.0 | CT | 11.0 |
| 23 * | 79.0 | G26 | 10.0 | CT | 11.0 |
| 24 | 79.0 | G27 | 10.0 | CT | 11.0 |
| 25 * | 82.0 | G28 | 10.0 | ST | 8.0 |
| 26 | 82.0 | G29 | 10.0 | ST | 8.0 |
| 27 | 82.0 | G30 | 10.0 | ST | 8.0 |
| 28 * | 85.0 | G15 | 2.0 | ST | 13.0 |
| 29 | 76.0 | G15 | 9.0 | T | 15.0 |

TABLE 2-continued

| Sample | Amount of first ceramic powder (wt %) | borosilicate glass Type | borosilicate glass Amount (wt %) | Second ceramic powder Type | Second ceramic powder Amount (wt %) |
|---|---|---|---|---|---|
| 30 | 79.0 | G15 | 9.0 | CT | 12.0 |
| 31 | 74.0 | G15 | 10.0 | ST | 6.0 |
| 32 | 80.0 | G15 | 9.0 | CT/T | 10.0/1.0 |
| 33 | 80.0 | G15 | 9.0 | ST/T | 10.0/1.0 |
| 34 | 83.5 | G15 | 9.0 | ST/T | 6.5/1.0 |
| 35 | 85.0 | G15 | 9.0 | ST/T | 5.0/1.0 |
| 36 | 80.5 | G15 | 9.0 | ST/T | 7.0/5.5 |
| 37 | 83.4 | G15 | 10.0 | ST/T | 6.5/0.1 |
| 38 | 80.5 | G15 | 10.0 | ST/T | 6.5/3.0 |
| 39 | 81.0 | G15 | 10.0 | CT/T | 8.0/1.0 |
| 40 | 77.0 | G15 | 10.0 | CT/T | 12.0/1.0 |
| 41 | 55.0 | G15 | 10.0 | T | 35.0 |
| 42 | 60.0 | G15 | 10.0 | T | 30.0 |
| 43 | 78.0 | G15 | 8.0 | ST | 14.0 |
| 44 | 73.0 | G15 | 9.0 | CT | 18.0 |
| 45 | 71.0 | G15 | 9.0 | CT | 20.0 |

In Table 2, a sample marked with an asterisk "*" represents a glass ceramic composition outside of the range of the present invention.

In Table 2, the "amount of first ceramic powder" column shows the amount of the $Mg_2SiO_4$ powder added as the first ceramic powder.

The "type" column in the "borosilicate glass" section represents the "type of glass" shown in Table 1. The "amount" column in the "borosilicate glass" section represents the amount of the borosilicate glass powder added.

The "type" column in the "second ceramic powder" section represents at least one of the $CaTiO_3$ (=CT) powder, the $SrTiO_3$ (=ST) powder, and the $TiO_2$ (=T) powder used as the second ceramic powder. The "amount" column in the "second ceramic powder" section represents the amount of the powder added.

Next, about 20 parts by weight of an acrylic resin as a binder and about 30 parts by weight of methyl ethyl ketone were added to 100 parts by weight of each glass ceramic composition for the corresponding sample shown in Table 2, and then granulation was performed. The resulting powder was pressed into a substantially columnar preform. The preform was fired at a temperature of about 1,000° C. or lower to form a sintered glass ceramic material sample.

As shown in Table 3, each sample was evaluated for dielectric constant ($\epsilon_r$), Qf value, temperature coefficient ($\tau_f$) of resonant frequency, and chemical stability.

The dielectric constant ($\epsilon_r$), the Qf value, and the temperature coefficient ($\tau_f$) of resonant frequency were measured by a dielectric resonator method. Dimensions of each sample were adjusted in such a manner that the measurement frequency is 10 GHz.

With respect to chemical stability, whether or not the Qf value was significantly degraded was checked after each sample that had been evaluated for the dielectric constant ($\epsilon_r$) and the Qf value, it was subjected to a pressure cooker test (PCT) at 120° C. and 95% RH for 100 hours. In Table 3, a sample that was not significantly degraded had satisfactory chemical stability and is thus indicated by "Good". A sample that was significantly degraded had unsatisfactory chemical stability and is thus indicated by "Poor".

As shown in Table 3, insulation reliability was also evaluated. A binder and an organic solvent were added to each glass ceramic composition for the corresponding sample shown in Table 2 to form a slurry. The resulting slurry was formed into sheets by a doctor blade method. A conductive paste for forming inner electrodes was applied by printing on the sheets. The resulting sheets were laminated, pressed, and fired to form a multilayer capacitor as a specimen. The resulting multilayer capacitors corresponding to the samples were subjected to an accelerated test at 120° C., 95% RH, and 15 V DC. After the accelerated test was performed for 100 hours, a sample in which significant insulation degradation was not observed had satisfactory insulation reliability and is indicated "Good" in Table 3. A sample in which significant insulation degradation was observed had unsatisfactory insulation reliability and is indicated "Poor" in Table 3.

TABLE 3

| Sample | $\epsilon_r$ | Qf (GHz) | $\tau_f$ (ppm · ° $C.^{-1}$) | Chemical stability | Insulation reliability |
|---|---|---|---|---|---|
| 1 | | | Not sintered | | |
| 2 | 9.5 | 28000 | −5 | Good | Good |
| 3 | 11.2 | 10500 | 5 | Good | Good |
| 4 * | 9.8 | 8500 | −15 | Poor | Poor |
| 5 * | 8.9 | 4800 | −15 | Good | Good |
| 6 | 9.1 | 12000 | −10 | Good | Good |
| 7 | 10.5 | 39000 | 12 | Good | Good |
| 8 | 9.5 | 36000 | 11 | Good | Good |
| 9 | 18 | 20000 | 60 | Good | Good |
| 10 * | 8.3 | 3800 | 20 | Poor | Poor |
| 11 | 9.2 | 26000 | −10 | Good | Good |
| 12 | 8.9 | 39000 | 5 | Good | Good |
| 13 * | | | Not sintered | | |
| 14 * | 10.5 | 24000 | −25 | Poor | Poor |
| 15 | 10.5 | 38500 | −22 | Good | Good |
| 16 | 8.9 | 39000 | −20 | Good | Good |
| 17 * | 8.9 | 39500 | −22 | Poor | Poor |
| 18 * | | | Not sintered | | |
| 19 | 12.4 | 18000 | 18 | Good | Good |
| 20 * | 11.0 | 1500 | 15 | Good | Good |
| 21 | 10.5 | 5500 | 14 | Good | Good |
| 22 | 9.5 | 20000 | 6 | Good | Good |
| 23 * | 8.8 | 20000 | −5 | Poor | Poor |
| 24 | 9.0 | 32000 | 5 | Good | Good |
| 25 * | 9.8 | 4400 | 8 | Good | Good |
| 26 | 9.7 | 12000 | 9 | Good | Good |
| 27 | 9.5 | 38000 | 6 | Good | Good |
| 28 * | | | Not sintered | | |
| 29 | 10.5 | 29000 | −15 | Good | Good |
| 30 | 9.0 | 31500 | 4 | Good | Good |
| 31 | 8.8 | 37000 | −5 | Good | Good |
| 32 | 11.0 | 48000 | 6 | Good | Good |
| 33 | 10.5 | 41000 | 10 | Good | Good |
| 34 | 8.9 | 52000 | 5 | Good | Good |
| 35 | 8.2 | 51000 | −12 | Good | Good |
| 36 | 10.2 | 32000 | 15 | Good | Good |
| 37 | 8.5 | 26000 | 31 | Good | Good |
| 38 | 9.5 | 36000 | 9 | Good | Good |
| 39 | 8.4 | 41000 | −9 | Good | Good |
| 40 | 9.8 | 40500 | 8 | Good | Good |
| 41 | 22 | 12000 | 50 | Good | Good |
| 42 | 18.0 | 15000 | 37 | Good | Good |
| 43 | 14.0 | 4500 | 51 | Good | Good |
| 44 | 16.0 | 11000 | 45 | Good | Good |
| 45 | 17.8 | 3800 | 48 | Good | Good |

In Table 3, a sample marked with an asterisk "*" is outside the range of the present invention.

The samples within the range of the present invention shown in Tables 2 and 3 each contain the borosilicate glass within the range of the present invention shown in Table 1, which is apparent from the "type" column in the "borosilicate glass" section in Table 2; the $Mg_2SiO_4$ powder as the first ceramic powder; and the second ceramic powder containing at least one ceramic powder selected from the $CaTiO_3$ powder, the $SrTiO_3$ powder and the $TiO_2$ powder. Thereby, the samples can be fired at a temperature of about 1,000° C. or lower. Furthermore, the samples each have satisfactory chemical stability, insulation reliability, a high Qf value, and a stable temperature coefficient $\tau_f$.

Glass G1 shown in Table 1 contains about less than 3 percent by weight of $Li_2O$. Sample 1 containing glass G1 shown in Tables 2 and 3 was not sintered at a temperature of about 1,000° C. or lower. Glass G4 contains more than about 15 percent by weight of $Li_2O$. Sample 4 containing glass G4 had a low Qf value and degraded chemical stability and insulation reliability.

Glass G5 contains less than about 20 percent by weight of MgO. Sample 5 containing glass G5 had a low Qf value. Glass G8 contains more than about 50 percent by weight of MgO; a phenomenon in which glass was partially crystallized, i.e., devitrification, occurred.

Glass G9 contains less than about 15 percent by weight of $B_2O_3$, resulting in difficulty in vitrification. Glass G12 contains more than about 30 percent by weight of $B_2O_3$. Sample 10 containing glass G12 had a low Qf value and degraded chemical stability and insulation reliability.

Glass G13 contains less than about 10 percent by weight of $SiO_2$, resulting in devitrification. Glass G16 contains more than about 45 percent by weight of $SiO_2$. Sample 13 containing glass G16 was not sintered at a temperature of about 1,000° C. or lower.

Glass G17 contains less than about 6 percent by weight of ZnO. Sample 14 containing glass G17 had degraded chemical stability. Glass G20 contains more than about 20 percent by weight of ZnO. Sample 17 containing glass G20 had degraded chemical stability and insulation reliability.

Glass G21 contains more than about 15 percent by weight of $Al_2O_3$. Sample 18 containing glass G21 was not sintered at a temperature of about 1,000° C. or lower.

Glass G23 contains more than about 25 percent by weight of BaO. Sample 20 containing glass G23 had a low Qf value.

Glass G26 contains more than about 15 percent by weight of CaO. Sample 23 containing glass G26 had degraded chemical stability and insulation reliability.

Glass G28 contains more than about 25 percent by weight of SrO. Sample 25 containing glass G28 had a low Qf value.

Furthermore, sample 28 was not sintered at a temperature of about 1,000° C. or lower as shown in Table 3, not because of the composition of the borosilicate glass shown in Table 1 but because of a borosilicate glass powder content of less than about 3 percent by weight as shown in Table 2.

Next, samples 12 and 29 to 45 which are within the range of the present invention and shown in Tables 2 and 3, each containing glass G15 as the composition of the borosilicate glass shown in Table 1 are compared with respect to, in particular, the second ceramic powder.

Among samples 30, 32, 39, 40, 44, and 45 each containing CT ($CaTiO_3$) as the second ceramic powder, sample 45 containing more than about 18 percent by weight of CT had a low Qf value and a high dielectric constant $\epsilon_r$. Thus, the CT content is preferably about 18 percent by weight or less.

Among samples 12, 31, 33 to 38, and 43 each containing ST ($SrTiO_3$) as the second ceramic powder, sample 43 containing more than about 13 percent by weight of ST had a low Qf value and a high dielectric constant $\epsilon_r$. Thus, the ST content is preferably about 13 percent by weight or less.

Among samples 29 and 32 to 42 each containing T ($TiO_2$) as the second ceramic powder, sample 41 containing more than about 30 percent by weight of T had a high dielectric constant $\epsilon_r$. Thus, the T content is preferably about 30 percent by weight or less.

When samples each contain about 8 to 12 percent by weight of CT and about 0.3 to 3 percent by weight of T, like samples 32, 39, and 40 each containing CT ($CaTiO_3$) and T ($TiO_2$), each temperature coefficient ($\tau_f$) of resonant frequency could be adjusted in the range of about ±10 ppm·° $C.^{-1}$. Furthermore, high Qf values could be obtained.

Among samples 33 to 38 each containing ST ($SrTiO_3$) and T ($TiO_2$) as the second ceramic powder, each temperature coefficient ($\tau_f$) of resonant frequency could be adjusted in the range of about ±10 ppm·° $C.^{-1}$ in samples 33, 34, and 38 each containing about 6 to 10 percent by weight of ST and about 0.3 to 3 percent by weight of T. Furthermore, high Qf values could be obtained. In contrast, in sample 35 in which the ST content was outside the range of about 6 to 10 percent by weight and in samples 36 and 37 in which the T contents are each outside the range of about 0.3 to 3 percent by weight, the absolute value of each temperature coefficient ($\tau_f$) of resonant frequency was larger than about 10 ppm·° $C.^{-1}$.

EXPERIMENTAL EXAMPLE 2

As borosilicate glass powders contained in glass ceramic compositions, borosilicate glass powders having various compositions shown in Table 4 were prepared.

TABLE 4

| Type of glass | LiO (wt %) | MgO (wt %) | BaO (wt %) | SrO (wt %) | $B_2O_3$ (wt %) | $SiO_2$ (wt %) | ZnO (wt %) |
|---|---|---|---|---|---|---|---|
| G51 | 4.5 | 29.0 | — | 17.0 | 19.0 | 23.5 | 7.0 |
| G52 | 4.5 | 25.5 | — | 17.0 | 19.0 | 27.0 | 7.0 |
| G53 | 4.5 | 30.0 | — | 17.0 | 19.0 | 23.0 | 6.5 |
| G54 | 4.5 | 30.5 | — | 18.0 | 20.0 | 21.0 | 6.0 |
| G55 | 4.5 | 30.5 | — | 18.0 | 21.0 | 20.0 | 6.0 |
| G56 | 4.5 | 33.5 | — | 18.0 | 19.0 | 19.0 | 6.0 |
| G57 | 4.5 | 29.5 | 5.5 | 8.0 | 20.0 | 26.5 | 6.0 |

As the first ceramic powder contained in the glass ceramic composition, a $Mg_2SiO_4$ powder was prepared as in Experimental Example 1. As the second ceramic powder, a $SrTiO_3$ powder having an average particle size (median particle size D50) of about 1.5 μm and a $TiO_2$ powder having an average particle size of about 1.0 μm were prepared.

Furthermore, a $SiO_2$ powder having an average particle size of about 1.0 μm was prepared for addition to the glass ceramic composition in some samples.

To obtain glass ceramic compositions for samples shown in Table 5, the first ceramic powder, the borosilicate glass powder, and the second ceramic powder were mixed. In some cases, the $SiO_2$ powder was further added.

TABLE 5

| Sample | Amount of first ceramic powder (wt %) | borosilicate glass Type | borosilicate glass Amount (wt %) | Second ceramic powder Type | Second ceramic powder Amount (wt %) | Amount of $SiO_2$ (part by weight) |
|---|---|---|---|---|---|---|
| 101 | 83.0 | G51 | 10.0 | ST/T | 6.0/1.0 | 0 |
| 102 | 83.0 | G51 | 10.0 | ST/T | 6.0/1.0 | 0.6 |
| 103 * | 83.0 | G51 | 10.0 | ST/T | 6.0/1.0 | 2.0 |

TABLE 5-continued

| Sample | Amount of first ceramic powder (wt %) | borosilicate glass Type | borosilicate glass Amount (wt %) | Second ceramic powder Type | Second ceramic powder Amount (wt %) | Amount of $SiO_2$ (part by weight) |
|---|---|---|---|---|---|---|
| 104 * | 83.0 | G52 | 10.0 | ST/T | 6.0/1.0 | 0 |
| 105 * | 83.0 | G52 | 10.0 | ST/T | 6.0/1.0 | 1.0 |
| 106 * | 83.0 | G52 | 10.0 | ST/T | 6.0/1.0 | 2.0 |
| 107 * | 83.0 | G53 | 10.0 | ST/T | 6.0/1.0 | 0 |
| 108 | 83.0 | G53 | 10.0 | ST/T | 6.0/1.0 | 0.2 |
| 109 | 83.0 | G53 | 10.0 | ST/T | 6.0/1.0 | 0.3 |
| 110 | 83.0 | G53 | 10.0 | ST/T | 6.0/1.0 | 0.5 |
| 111 | 83.0 | G53 | 10.0 | ST/T | 6.0/1.0 | 0.9 |
| 112 * | 83.0 | G53 | 10.0 | ST/T | 6.0/1.0 | 1.2 |
| 113 * | 83.0 | G54 | 10.0 | ST/T | 6.0/1.0 | 0 |
| 114 | 83.0 | G54 | 10.0 | ST/T | 6.0/1.0 | 0.4 |
| 115 | 83.0 | G54 | 10.0 | ST/T | 6.0/1.0 | 0.7 |
| 116 | 83.0 | G54 | 10.0 | ST/T | 6.0/1.0 | 1.0 |
| 117 * | 83.0 | G54 | 10.0 | ST/T | 6.0/1.0 | 1.5 |
| 118 * | 83.0 | G55 | 10.0 | ST/T | 6.0/1.0 | 0 |
| 119 | 83.0 | G55 | 10.0 | ST/T | 6.0/1.0 | 0.6 |
| 120 | 83.0 | G55 | 10.0 | ST/T | 6.0/1.0 | 0.9 |
| 121 * | 83.0 | G55 | 10.0 | ST/T | 6.0/1.0 | 1.2 |
| 122 * | 83.0 | G56 | 10.0 | ST/T | 6.0/1.0 | 0 |
| 123 * | 83.0 | G56 | 10.0 | ST/T | 6.0/1.0 | 0.9 |
| 124 * | 83.0 | G56 | 10.0 | ST/T | 6.0/1.0 | 1.5 |
| 125 | 83.0 | G57 | 10.0 | ST/T | 6.0/1.0 | 0 |
| 126 | 83.0 | G57 | 10.0 | ST/T | 6.0/1.0 | 1.0 |
| 127 * | 83.0 | G57 | 10.0 | ST/T | 6.0/1.0 | 1.2 |

In Table 5, a sample marked with an asterisk "*" represents a glass ceramic composition outside the preferred range of the present invention from the standpoint of the rate of change of capacitance.

In Table 5, the "amount of first ceramic powder", the "borosilicate glass", and the "second ceramic powder" columns each represent the same content as in Table 2. The unit of the "amount of $SiO_2$" is expressed as "part by weight" relative to the 100 parts by weight of the total amount of the first ceramic powder, the second ceramic powder, and the borosilicate glass powder.

As shown in Table 6, the glass ceramic compositions corresponding to the samples shown in Table 5 were each evaluated for dielectric constant ($\epsilon_r$), Qf value, temperature coefficient ($\tau_f$) of resonant frequency, chemical stability, and insulation reliability in the same procedure as in Experimental Example 1. Furthermore, the rate of change of capacitance was evaluated as follows: A multilayer capacitor produced for the evaluation of insulation reliability was subjected to the same accelerated test as that for evaluation of insulation reliability. The rate of change of capacitance was determined by the use of the formula:

$$(\%) = \{(C_1 - C_0)/C_0\} \times 100$$

where $C_0$ represents capacitance before the test; and $C_1$ represents capacitance after the test.

TABLE 6

| Sample | $\epsilon_r$ | Qf (GHz) | $\tau_f$ (ppm·°C.$^{-1}$) | Chemical stability | Insulation reliability | Rate of change of capacitance |
|---|---|---|---|---|---|---|
| 101 | 8.6 | 50000 | 5 | Good | Good | 0.2 |
| 102 | 8.6 | 48000 | 3 | Good | Good | 0.1 |
| 103 * | 8.5 | 38000 | −2 | Good | Good | 0.6 |
| 104 * | 8.7 | 48000 | 3 | Good | Good | 0.6 |
| 105 * | 8.3 | 32000 | −10 | Good | Good | 1.1 |
| 106 * | | | Satisfactory sheet was not prepared | | | |
| 107 * | 8.8 | 54000 | 5 | Good | Good | 0.6 |
| 108 | 8.8 | 52000 | 5 | Good | Good | 0.4 |
| 109 | 8.7 | 48000 | −5 | Good | Good | 0.3 |
| 110 | 8.6 | 46000 | −6 | Good | Good | 0.1> |
| 111 | 8.4 | 42000 | −10 | Good | Good | 0.3 |
| 112 * | 8.2 | 39000 | −20 | Good | Good | 0.7 |
| 113 * | 8.8 | 55000 | 5 | Good | Good | 0.8 |
| 114 | 8.6 | 52000 | 5 | Good | Good | 0.5 |
| 115 | 8.6 | 42000 | −11 | Good | Good | 0.3 |
| 116 | 8.4 | 39000 | −15 | Good | Good | 0.3 |
| 117 * | 8.1 | 25000 | −30 | Good | Good | 1.1 |
| 118 * | 8.8 | 54000 | 6 | Good | Good | 1.8 |
| 119 | 8.4 | 45000 | −11 | Good | Good | 0.2 |
| 120 | 8.4 | 43000 | −15 | Good | Good | 0.3 |
| 121 * | | | Satisfactory sheet was not prepared | | | |
| 122 * | 8.9 | 56000 | 5 | Good | Good | 1.8 |
| 123 * | 8.5 | 42000 | −20 | Good | Good | 1.5 |

TABLE 6-continued

| Sample | $\epsilon_r$ | Qf (GHz) | $\tau_f$ (ppm·°C.$^{-1}$) | Chemical stability | Insulation reliability | Rate of change of capacitance |
|---|---|---|---|---|---|---|
| 124 * | | | Satisfactory sheet was not prepared | | | |
| 125 | 8.6 | 42000 | 5 | Good | Good | 0.1> |
| 126 | 8.4 | 40000 | −10 | Good | Good | 0.4 |
| 127 * | 8.3 | 35000 | −15 | Good | Good | 1.1 |

In Table 6, a sample marked with an asterisk "*" is outside the preferred range of the present invention.

Except for samples 106, 121 and 124, samples 101 to 127 shown in Table 6 exhibited an excellent dielectric constant ($\epsilon_r$) Qf value, temperature coefficient ($\tau_f$) of resonant frequency, chemical stability, and insulation reliability.

With respect to the rate of change of capacitance, comparisons were made among samples 101, 104, 107, 113, 118, 122 and 125 each not containing $SiO_2$ shown in Table 5. The results demonstrated that only samples 101 and 125 exhibited a rate of change of capacitance of about 0.5% or less as shown in Table 6. This is because borosilicate glass composition G51 contained in sample 101 and borosilicate glass composition G57 contained in sample 125 each contain about 23.5 to 26.5 percent by weight of $SiO_2$.

In contrast, borosilicate glass compositions G52, G53, G54, G55 and G56 contained in samples 104, 107, 113, 118 and 122, respectively, each contain less than about 23.5 percent by weight of $SiO_2$ or more than about 26.5 percent by weight of $SiO_2$ as shown in Table 4.

However, as described above, in samples 107, 113 and 118 including borosilicate glass compositions G53, G54 and G55, respectively, each containing about 20 to 26.5 percent by weight of $SiO_2$ among samples 104, 107, 113, 118 and 122 each exhibiting a rate of change of capacitance of about 0.5% or more, the separate addition of about 1 part by weight of the $SiO_2$ powder resulted in about 0.5% or less of the rate of change of capacitance. Specifically, sample 107 was compared with samples 108 to 111. Sample 113 was compared with samples 114 to 116. Sample 118 was compared with samples 119 and 120. The results demonstrated that the separate addition of 1 part by weight of the $SiO_2$ powder resulted in about 0.5% or less of the rate of change of capacitance as long as the content of $SiO_2$ in the borosilicate glass was in the range of about 20 to 26.5 percent by weight.

Although the content of $SiO_2$ in the borosilicate glass was in the range of about 20 to 26.5 percent by weight, however, the separate addition of more than 1 part by weight of $SiO_2$ resulted in more than 0.5% of the rate of change of capacitance. Furthermore, an appropriate green sheet was not formed because of the slurry having increased viscosity, in some cases. Specifically, in sample 103, the amount of $SiO_2$ added was 2.0 parts by weight and the rate of change of capacitance was increased to 0.6%. In sample 112, the amount of $SiO_2$ added was 1.2 parts by weight and the rate of change of capacitance was increased to 0.7%. In sample 117, the amount of $SiO_2$ added was 1.5 parts by weight and the rate of change of capacitance was increased to 1.1%. In sample 121, since the amount of $SiO_2$ added was 1.2 parts by weight, an appropriate green sheet was not formed. In sample 127, since the amount of $SiO_2$ added was 1.2 parts by weight, the rate of change of capacitance was increased to In samples 104 to 106 and 122 to 124 including glass G52 or glass G56 in which the content of $SiO_2$ in the borosilicate glass powder was outside the range of 20 to 26.5 percent by weight, despite the amount of the $SiO_2$ powder being separately added, the rate of change of capacitance exceeded 0.5% or an appropriate green sheet was not formed. That is, favorable results were not obtained.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A glass ceramic composition comprising:
   about 55 percent by weight or more of a first ceramic powder mainly composed of forsterite;
   about 6 to 30 percent by weight of a second ceramic powder containing at least one ceramic powder selected from the group consisting of a ceramic powder mainly composed of calcium titanate, a ceramic powder mainly composed of strontium titanate, and a ceramic powder mainly composed of titanium oxide;
   about 3 to 20 percent by weight or more of a borosilicate glass powder containing about 3 to 15 percent by weight of lithium calculated as $Li_2O$, about 20 to 50 percent by weight of magnesium calculated as MgO, about 15 to 30 percent by weight of boron calculated as $B_2O_3$, about 10 to 45 percent by weight of silicon calculated as $SiO_2$, about 6 to 20 percent by weight of zinc calculated as ZnO, and 0 to about 15 percent by weight of aluminum calculated as $Al_2O_3$, and
   a positive amount up to about 1 part by weight of silicon calculated as $SiO_2$ relative to 100 parts by weight of the total amount of the first ceramic powder, the second ceramic powder and the borosilicate glass powder;
   wherein the borosilicate glass powder contains at least about 2 percent by weight of an additive selected from the group consisting of calcium oxide, barium oxide, strontium oxide and mixtures thereof, calculated as CaO, BaO and SrO, respectively, and
   wherein the upper limit of the calcium oxide content of the borosilicate glass powder is about 15 percent by weight, the upper limit of the barium oxide content of the borosilicate glass powder is about 25 percent by weight and the upper limit of the strontium oxide content of the borosilicate glass powder is about 25 percent by weight.

2. A glass ceramic composition comprising:
   about 55 percent by weight or more of a first ceramic powder mainly composed of forsterite;
   about 6 to 30 percent by weight of a second ceramic powder containing at least one ceramic powder selected from the group consisting of a ceramic powder mainly composed of calcium titanate, a ceramic powder mainly composed of strontium titanate, and a ceramic powder mainly composed of titanium oxide;
   about 3 to 20 percent by weight or more of a borosilicate glass powder containing about 3 to 15 percent by weight of lithium calculated as $Li_2O$, about 20 to 50 percent by weight of magnesium calculated as MgO, about 15 to 30 percent by weight of boron calculated as $B_2O_3$, about 10 to 45 percent by weight of silicon calculated as $SiO_2$, about 6 to 20 percent by weight of zinc calculated as ZnO, and 0 to about 15 percent by weight of aluminum calculated as $Al_2O_3$, and a positive amount up to 2.5 percent by weight of at least one third ceramic powder selected from the group consisting of up to 0.5 percent by weight of a copper oxide-based ceramic powder mainly composed of copper oxide, up to 1 percent by weight of a iron oxide-based ceramic powder mainly composed of iron oxide, and up to 2 percent by weight of a manganese oxide-based ceramic powder mainly composed of manganese oxide wherein the borosilicate glass powder contains at least about 2 percent by weight of an additive selected from the group consisting of calcium oxide, barium oxide, strontium oxide and mixtures thereof, calculated as CaO, BaO and SrO, respectively, and wherein the upper limit of the calcium oxide content of the borosilicate glass powder is about 15 percent by weight, the upper limit of the barium oxide content of the borosilicate glass powder is about 25 percent by weight, and the upper limit of the strontium oxide content of the borosilicate glass powder is about 25 percent by weight.

3. A glass ceramic composition comprising:

a first ceramic powder mainly composed of forsterite;

a second ceramic powder containing at least one ceramic powder selected from the group consisting of a ceramic powder mainly composed of calcium titanate, a ceramic powder mainly composed of strontium titanate, and a ceramic powder mainly composed of titanium oxide; and about 3 percent by weight or more of a borosilicate glass powder containing about 3 to 15 percent by weight of lithium calculated as $Li_2O$, about 20 to 50 percent by weight of magnesium calculated as MgO, about 15 to 30 percent by weight of boron calculated as $B_2O_3$, about 23.5 to 26.5 percent by weight calculated as $SiO_2$, about 6 to 20 percent by weight of zinc calculated as ZnO, and 0 to about 15 percent by weight of aluminum calculated as $Al_2O_3$, wherein the borosilicate glass powder contains at least about 2 percent by weight of an additive selected from the group consisting of calcium oxide, barium oxide, strontium oxide and mixtures thereof, calculated as CaO, BaO and SrO, respectively, and wherein the upper limit of the calcium oxide content of the borosilicate glass powder is about 15 percent by weight, the upper limit of the barium oxide content of the borosilicate glass powder is about 25 percent by weight, and the upper limit of the strontium oxide content of the borosilicate glass powder is about 25 percent by weight.

4. The glass ceramic composition according to claim 1, wherein the borosilicate glass powder has a silicon content of about 20 to 26.5 percent by weight calculated as SiO.

5. A multilayer ceramic electronic component comprising the combination of a plurality of laminated glass ceramic layers comprising glass ceramic material; and a plurality of conductors comprising copper or silver, wherein the glass ceramic layers comprise a sintered glass ceramic composition comprising:

about 55 percent by weight or more of a first ceramic powder mainly composed of forsterite;

about 6 to 30 percent by weight of a second ceramic powder containing at least one ceramic powder selected from the group consisting of a ceramic powder mainly composed of calcium titanate, a ceramic powder mainly composed of strontium titanate, and a ceramic powder mainly composed of titanium oxide; and about 3 to 20 percent by weight or more of a borosilicate glass powder containing about 3 to 15 percent by weight of lithium calculated as $Li_2O$, about 20 to 50 percent by weight of magnesium calculated as MgO, about 15 to 30 percent by weight of boron calculated as $B_2O_3$, about 10 to 45 percent by weight of silicon calculated as $SiO_2$, about 6 to 20 percent by weight of zinc calculated as ZnO, and 0 to about 15 percent by weight of aluminum calculated as $Al_2O_3$, wherein the borosilicate glass powder contains at least about 2 percent by weight of an additive selected from the group consisting of calcium oxide, barium oxide, strontium oxide and mixtures thereof, calculated as CaO, BaO and SrO, respectively, and wherein the upper limit of the calcium oxide content of the borosilicate glass powder is about 15 percent by weight, the upper limit of the barium oxide content of the borosilicate glass powder is about 25 percent by weight, and the upper limit of the strontium oxide content of the borosilicate glass powder is about 25 percent by weight.

6. A monolithic ceramic electronic component comprising a fired combination of a plurality of stacked glass-ceramic layers; and conductors disposed on or in the glass-ceramic layers, wherein the glass-ceramic layers comprise the glass-ceramic composition according to claim 1 and the conductors comprise copper or silver.

7. A monolithic ceramic electronic component comprising a fired combination of a plurality of stacked glass-ceramic layers; and conductors disposed on or in the glass-ceramic layers, wherein the glass-ceramic layers comprise the glass-ceramic composition according to claim 2 and the conductors comprise copper or silver.

8. A monolithic ceramic electronic component comprising a fired combination of a plurality of stacked glass-ceramic layers; and conductors disposed on or in the glass-ceramic layers, wherein the glass-ceramic layers comprise the glass-ceramic composition according to claim 3 and the conductors comprise copper or silver.

9. The glass ceramic composition according to claim 3, wherein in which the glass ceramic compositions contains about 55 percent by weight or more of the first ceramic powder; about 6 to 30 percent by weight of the second ceramic powder; and about 3 to 20 percent by weight or more of the borosilicate glass powder.

10. A monolithic ceramic electronic component comprising a fired combination of a plurality of stacked glass-ceramic layers; and conductors disposed on or in the glass-ceramic layers, wherein the glass-ceramic layers comprise the glass-ceramic composition according to claim 9 and the conductors comprise copper or silver.

11. The glass ceramic composition according to claim 4 wherein in which the glass ceramic compositions contains about 55 percent by weight or more of the first ceramic powder; about 6 to 30 percent by weight of the second ceramic powder; and about 3 to 20 percent by weight or more of the borosilicate glass powder.

12. A monolithic ceramic electronic component comprising a fired combination of a plurality of stacked glass-ceramic layers; and conductors disposed on or in the glass-ceramic layers, wherein the glass-ceramic layers comprise the glass-ceramic composition according to claim 11 and the conductors comprise copper or silver.

* * * * *